United States Patent
Kaczman et al.

(10) Patent No.: US 8,797,103 B2
(45) Date of Patent: Aug. 5, 2014

(54) APPARATUS AND METHODS FOR CAPACITIVE LOAD REDUCTION

(75) Inventors: Daniel Lee Kaczman, Newbury Park, CA (US); James Phillip Young, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 24 days.

(21) Appl. No.: 13/312,899

(22) Filed: Dec. 6, 2011

(65) Prior Publication Data

US 2012/0139641 A1    Jun. 7, 2012

Related U.S. Application Data

(60) Provisional application No. 61/420,702, filed on Dec. 7, 2010.

(51) Int. Cl.
    *H03F 3/14*    (2006.01)
(52) U.S. Cl.
    USPC .............................. 330/307; 330/127; 330/295
(58) Field of Classification Search
    USPC ...................... 330/126, 127, 295, 124 R, 307
    See application file for complete search history.

(56) References Cited

U.S. PATENT DOCUMENTS

| | | | |
|---|---|---|---|
| 5,264,752 A | 11/1993 | Savicki | |
| 6,157,253 A * | 12/2000 | Sigmon et al. | 330/124 R |
| 6,639,462 B1 * | 10/2003 | Luu | 330/297 |
| 7,348,842 B2 | 3/2008 | Ichitsubo et al. | |
| 7,482,869 B2 | 1/2009 | Wilson | |
| 7,515,879 B2 | 4/2009 | Okabe et al. | |
| 7,679,451 B2 * | 3/2010 | Chen et al. | 330/297 |
| 7,880,548 B2 * | 2/2011 | Ye et al. | 330/297 |
| 8,344,806 B1 * | 1/2013 | Franck et al. | 330/297 |
| 2002/0030543 A1 | 3/2002 | French et al. | |
| 2003/0155978 A1 | 8/2003 | Pehlke | |
| 2007/0210771 A1 | 9/2007 | Wilson et al. | |
| 2007/0249304 A1 | 10/2007 | Snelgrove et al. | |
| 2007/0273449 A1 | 11/2007 | Wilson | |
| 2007/0279019 A1 | 12/2007 | Wilson | |
| 2009/0128236 A1 | 5/2009 | Wilson | |

(Continued)

FOREIGN PATENT DOCUMENTS

GB    2398648    8/2004
GB    2409115    11/2006

(Continued)

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.

(Continued)

*Primary Examiner* — Khanh V Nguyen
(74) *Attorney, Agent, or Firm* — Knobbe, Martens, Olson & Bear, LLP

(57) ABSTRACT

Apparatus and methods for capacitive load reduction are disclosed. In one embodiment, a power amplifier system includes an envelope tracker configured to provide a supply voltage to a plurality of power amplifiers. The power amplifiers include power supply inputs electrically connected in a star configuration so as to reduce a capacitive load of the envelope tracker. The distributed capacitance of the power amplifiers is used to provide RF grounding so as to reduce the size of or eliminated the use of bypass capacitors.

21 Claims, 13 Drawing Sheets

(56) References Cited

U.S. PATENT DOCUMENTS

| | | |
|---|---|---|
| 2009/0289720 A1 | 11/2009 | Takinami et al. |
| 2009/0302941 A1 | 12/2009 | Wimpenny |
| 2010/0045385 A1 | 2/2010 | Pengelly |

FOREIGN PATENT DOCUMENTS

| | | |
|---|---|---|
| GB | 2426392 | 5/2007 |
| GB | 2411062 | 11/2007 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Huang et al. "A Mash Controlled Multilevel Power Converter for High-Efficiency RF Transmitters," IEEE Transactions on Power Electronics, vol. 26, No. 4, Apr. 2011, pp. 1205-1214.

Kaneta et al. "Architecture of Wideband High-Efficiency Envelope Tracking Power Amplifier for Base Station," IEICE Technical Report, Osaka, 2009.

Kang et al. "A Multimode/Multiband Power Amplifier With a Boosted Supply Modulator," IEEE Transactions on Microwave Theory and Techniques, vol. 58, No. 10, Oct. 2010, pp. 2598-2608.

Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.

Wu et al. "A Two-Phase Switching Hybrid Supply Modulator for Polar Transmitters with 9% Efficiency Improvement," IEEE International Solid-State Circuits Conference, Feb. 2010, pp. 196-198.

Yousefzadeh et al. "Three-Level Buck Converter for Envelope Tracking Applications," IEEE Transactions on Power Electronics, vol. 21, No. 2, Mar. 2006, pp. 549-552.

K.T. et al., "A GaAs MCM Power Amplifier of 3.6V Operation with High Efficiency of 49% for 0.9GHz Digital Cellular Phone Systems," IEEE Trans. on Microw. Theory Tech., vol. 43, No. 11, Nov. 1995, pp. 2539-2542.

Search Report and Written Opinion of Jul. 30, 2012 for International Application No. PCT/US2011/063821. 10 pages.

* cited by examiner

APPARATUS AND METHODS FOR CAPACITIVE LOAD REDUCTION

CROSS-REFERENCE TO RELATED APPLICATIONS

This application claims the benefit of priority under 35 U.S.C. §119(e) of U.S. Provisional Patent Application No. 61/420,702, filed Dec. 7, 2010 entitled "APPARATUS AND METHOD FOR CAPACITIVE LOAD REDUCTION", which is herein incorporated by reference in its entirety.

BACKGROUND

1. Field

Embodiments of the invention relate to radio frequency (RF) electronic systems, and in particular, to power amplifier systems.

2. Description of the Related Technology

Power amplifiers can be included in mobile devices to amplify a RF signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal having a relatively low power. It can be important to manage the amplification of a RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier can be an important consideration. One technique for reducing power consumption of a power amplifier is envelope tracking, in which the voltage level of the power supply of the power amplifier is varied in relation to the envelope of the RF signal. However, a power supply node can have a relatively large capacitance. Thus, varying the voltage level of the power supply of the power amplifier in relation to the envelope of the RF signal can require a relatively large envelope tracking module, which can be relatively expensive and can consume relatively large amounts of power.

There is a need for improved power amplifiers. Furthermore, there is a need for power amplifiers having improved power efficiency.

SUMMARY

In certain embodiments, the present disclosure relates to a mobile device including a phone board, a multi-chip module disposed on the phone board, and an envelope tracking module disposed on the phone board. The multi-chip module includes a plurality of power amplifiers formed on one or more power amplifier dies, each power amplifier having a supply input for receiving a power supply. The supply inputs of the plurality of power amplifiers electrically connected to a first star network of the multi-chip module such that interconnect associated with each of the supply inputs of the power amplifiers meets at a first star node. The envelope tracking module is electrically connected to the first star network and configured to control a voltage level of the first star network.

In various embodiments, a distributed capacitance of the first star network is configured to operate as a low impedance path to radio frequency signals so as to avoid a need for bypass capacitors local to each of the plurality of power amplifiers.

In some embodiments, each of the plurality of power amplifiers includes a first stage and a second stage, the first stage configured to drive the second stage. The envelope tracking module is configured to electrically power the second stage of each of the plurality of power amplifiers.

In a number of embodiments, each of the plurality of power amplifiers includes a first stage supply input, the first stage supply inputs electrically connected to a second star network such that interconnect associated with each of the first stage supply inputs of the power amplifiers meets at a second star node.

In accordance with several embodiments, the mobile device further includes a DC-to-DC converter disposed on the phone board, the DC-to-DC converter configured to control a voltage level of the second star network.

According to some embodiments, the first star network is electrically connected to the second star network on the phone board so as to reduce injection of signals from the second stages into the first stages.

In certain embodiments, the mobile device further includes a battery electrically connected to the second star network.

In several embodiments, the plurality of power amplifiers includes at least three power amplifiers.

In some embodiments, the first star node is contained within an area of a substrate of the multi-chip module that is less than about 0.16 mm$^2$.

In certain embodiments, the present disclosure relates to a power amplifier module including a plurality of power amplifiers configured to amplify one or more radio frequency signals, each power amplifier having a supply input for receiving a power supply. The power amplifier module further includes a first star network electrically connected to the supply inputs of each of the plurality of power amplifiers such that a portion of trace associated with each of the supply inputs of the power amplifiers meets at a first star node, each portion of trace including a spiral inductor configured to operate as a radio frequency choke. The power amplifier module further includes a first power supply pin electrically connected to the first star node.

According to several embodiments, a distributed capacitance of the first star network is configured to operate as a low impedance path to radio frequency signals.

In some embodiments, the first power supply pin is configured to receive a supply voltage from an envelope tracker having a modulation bandwidth, and each spiral inductor is sized such that a frequency associated with a resonance of the spiral inductor and the distributed capacitance is greater than the modulation bandwidth.

In various embodiments, each portion of trace associated with the supply inputs of the power amplifiers has a length in the range of about 500 μm to about 5,000 μm.

In some embodiments, the power amplifier module further includes a capacitor having a first end electrically connected to the first star node and a second end electrically connected to a first voltage supply.

In certain embodiments, the capacitor is formed on a laminate of the power amplifier module.

In a number of embodiments, each spiral inductor includes a capacitor electrically connected between a tap of the spiral inductor and a first voltage supply, each spiral inductor and capacitor configured to provide second harmonic termination to an associated power amplifier.

In some embodiments, the power amplifier module further includes a duplexer configured to duplex between a differential receive voltage and at least one output of the plurality of power amplifiers.

In a number of embodiments, the power amplifier module further includes a plurality of output pins and a plurality of switches electrically connected to a plurality of outputs of the power amplifiers, the plurality of output pins greater in number than the plurality of outputs of the power amplifiers.

In several embodiments, the power amplifier module further includes a second star network electrically connected to a first stage supply input of each of the plurality of power amplifiers such that a portion of trace associated with each of the first stage supply inputs of the power amplifiers meets at a second star node.

In certain embodiments, the present disclosure relates to a method of power amplification in a radio frequency system. The method includes providing a plurality of power amplifiers for amplifying one or more radio frequency signals, each power amplifier having a supply input for receiving a power supply. The method further includes electrically powering the plurality of power amplifiers using a star configuration such that a portion of interconnect associated with each of the supply inputs of the power amplifiers meets at a star node. The method further includes controlling a voltage level of the power supply provided to the supply inputs of the power amplifiers using an envelope tracker.

In some embodiments, the method further includes choking radio frequency signals associated with the plurality of power amplifiers using a plurality of inductors, each of the inductors disposed in a signal path between the star node and the supply input of an associated power amplifier.

In several embodiments, the method further includes using a distributed capacitance associated with the star node to provide radio frequency grounding.

DETAILED DESCRIPTION OF EMBODIMENTS

The headings provided herein, if any, are for convenience only and do not necessarily affect the scope or meaning of the claimed invention.

Overview of Power Amplifier Systems

Figure 1:
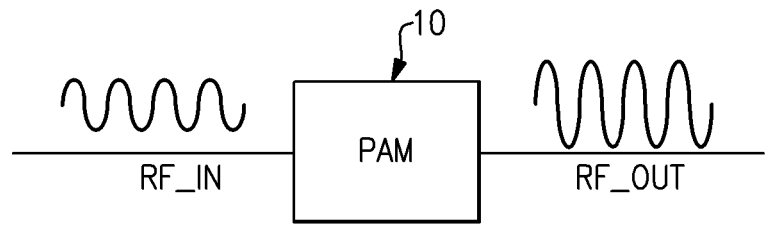
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module 10 can be configured to amplify an RF signal RF_IN to generate an amplified RF signal RF_OUT. As described herein, the power amplifier module 10 can include one or more power amplifiers.

Figure 2:
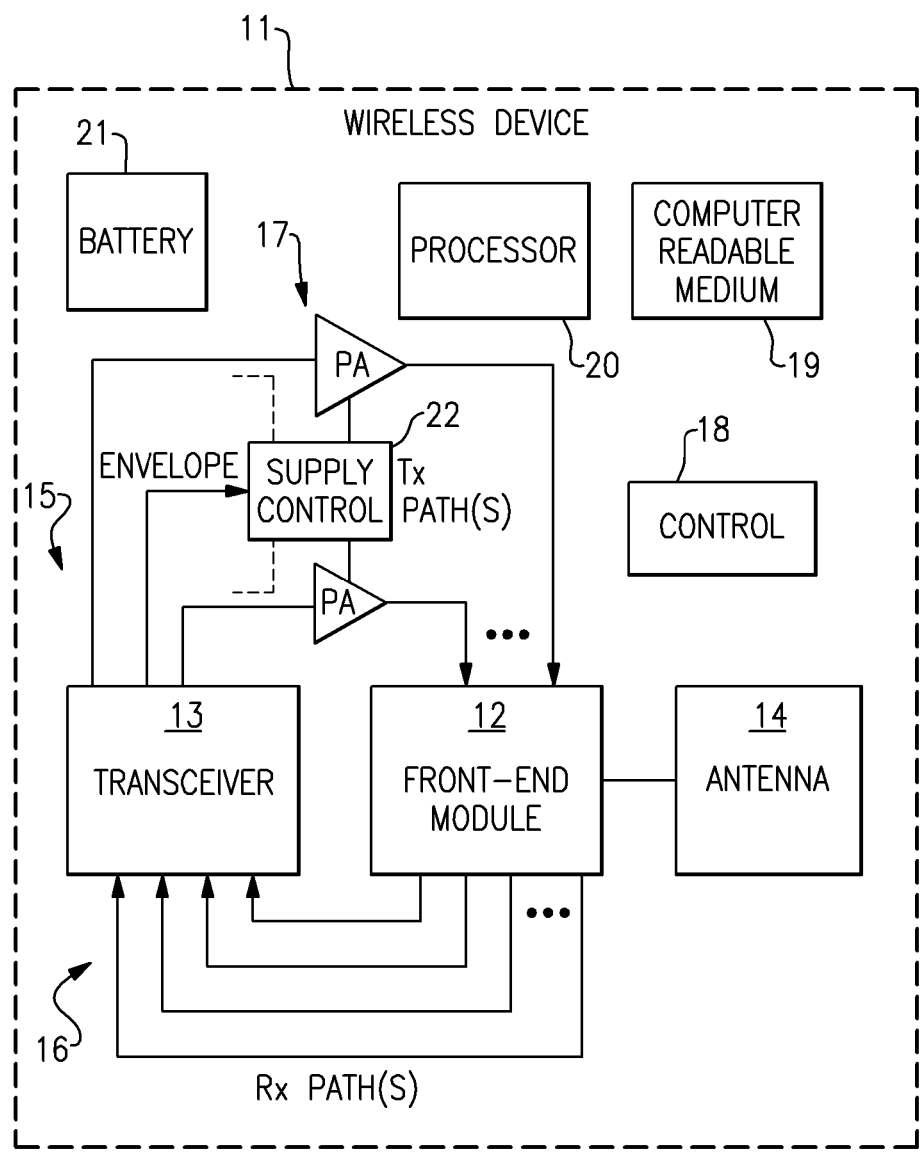
FIG. 2 is a schematic block diagram of an example wireless device that can include one or more of the power amplifier modules of FIG. 1.

FIG. 2 is a schematic block diagram of an example wireless device 11 that can include one or more of the power amplifier modules 10 of FIG. 1. The wireless device 11 can also implement one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 3G and 4G are non-limiting examples of such standards.

In certain embodiments, the wireless device 11 can include a front-end module 12, a transceiver 13, an antenna 14, power amplifiers 17, a control component 18, a computer readable medium 19, a processor 20, a battery 21, and a power control or supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands.

In FIG. 2, one or more detected signals from the antenna 14 are depicted as being provided to the transceiver 13 via one or more receiving paths 16. In the example shown, different receiving paths 16 can represent paths associated with different bands. For example, the four example receiving paths 16 shown can represent quad-band capability that some wireless devices are provided with.

To facilitate switching between receive and transmit paths, the front-end module 12 can be configured to electrically connect the antenna 14 to a selected transmit or receive path. Thus, the front-end module 12 can provide a number of switching functionalities associated with operation of the wireless device 11. In certain embodiments, the front-end module 12 can include a number of switches configured to provide functionalities associated with, for example, switching between different bands, switching between different power modes, switching between transmission and receiving modes, or some combination thereof. The front-end module 12 can also be configured to provide additional functionality, including filtering and/or duplexing of signals.

FIG. 2 shows that in certain embodiments, a control component 18 can be provided for controlling various control functionalities associated with operations of the front-end module 12, the power amplifiers 17, the supply control block 22, and/or other operating components.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The illustrated wireless device 11 also includes the supply control block 22, which can be used to provide a power supply voltage to one or more of the power amplifiers 17. For example, the supply control block 22 can include an envelope tracker configured to vary the supply voltage provided to the power amplifiers 17 based upon an envelope of the RF signal to be amplified. However, in certain embodiments the supply control block 22 can include other components.

The supply control block 22 can be electrically connected to the battery 21, and the supply control block 22 can be configured to generate the supply voltage for the power amplifiers 17. The battery 21 can be any suitable battery for use in the wireless device 11, including, for example, a lithium-ion battery. As will be described in detail further below, by varying the voltage provided to the power amplifiers, the power consumed from the battery 21 can be reduced, thereby improving the battery life of the wireless device 11. In certain implementations, the supply control block 22 can control the power amplifier supply voltage based on an envelope of the RF signal to be amplified. The envelope signal can be provided to the supply control block 22 from the transceiver 13. However, the envelope can be determined in other ways. For example, the envelope can be determined by detecting the envelope from the RF signal using any suitable envelope detector.

Figure 3:
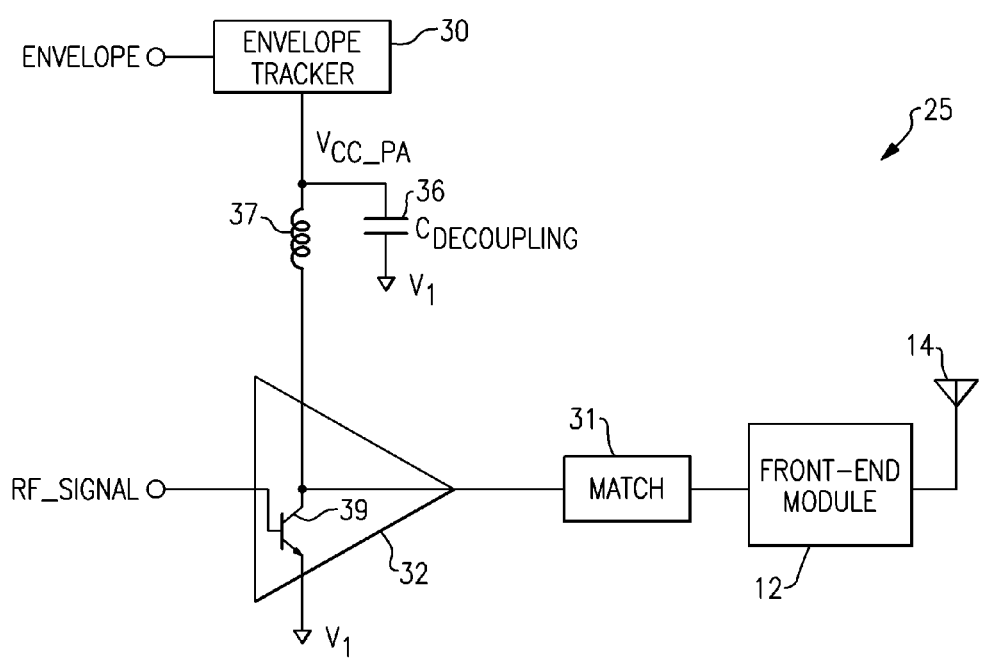
FIG. 3 is a schematic diagram of one example of a power amplifier system.

FIG. 3 is a schematic diagram of one example of a power amplifier system 25. The illustrated power amplifier system 25 includes the front-end module 12, the antenna 14, an envelope tracker 30, an impedance matching block 31, a power amplifier 32, a decoupling or bypass capacitor 36, and an inductor 37. The illustrated envelope tracker 30 is configured to receive an envelope signal ENVELOPE and to generate a power amplifier supply voltage $V_{CC\_PA}$ for the power amplifier 32.

The illustrated power amplifier 32 includes a bipolar transistor 39 having an emitter, a base, and a collector. The emitter of the bipolar transistor 39 can be electrically connected to a first voltage reference $V_1$, which can be, for example, a ground node. A radio frequency (RF) signal RF_SIGNAL can be provided to the base of the bipolar transistor 39. The bipolar transistor 39 can amplify the RF signal RF_SIGNAL and provide the amplified RF signal at the collector. The bipolar transistor 39 can be any suitable device. In one implementation, the bipolar transistor 39 is a heterojunction bipolar transistor (HBT).

Although FIG. 3 illustrates one example of a power amplifier suitable for use with the teachings herein, the teachings herein can be applied to a variety of power amplifier structures, such as multi-stage power amplifier structures and power amplifiers employing other transistor structures. For example, in some implementations the bipolar transistor 39 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor.

The power amplifier 32 can be configured to provide the amplified RF signal to the front-end module 12. The impedance matching block 31 can be used to aid in terminating the electrical connection between the power amplifier 32 and the front-end module 12. For example, the impedance matching block 31 can be used to increase power transfer and/or reduce reflections of the amplified RF signal generated using the power amplifier 32.

The inductor 37 can be used to provide the power amplifier supply voltage $V_{CC\_PA}$ to the power amplifier 32 while choking or blocking high frequency RF signal components. The inductor 37 can include a first end electrically connected to the envelope tracker 30, and a second end electrically connected to the collector of the bipolar transistor 39.

The decoupling capacitor 36 includes a first end electrically connected to the first end of the inductor 37 and a second end electrically coupled to the first supply voltage $V_1$. The decoupling capacitor 36 can provide a low impedance path to high frequency signals, thereby reducing the noise of the power amplifier supply voltage $V_{CC\_PA}$, improving power amplifier stability, and/or improving the performance of the inductor 37 as a RF choke.

As will be described in detail further below, in certain implementations, power amplifiers can be electrically connected in a star configuration to reduce the size of the capacitor 36 or to eliminate the capacitor 36 from the power amplifier system 25 altogether.

Figure 4A:
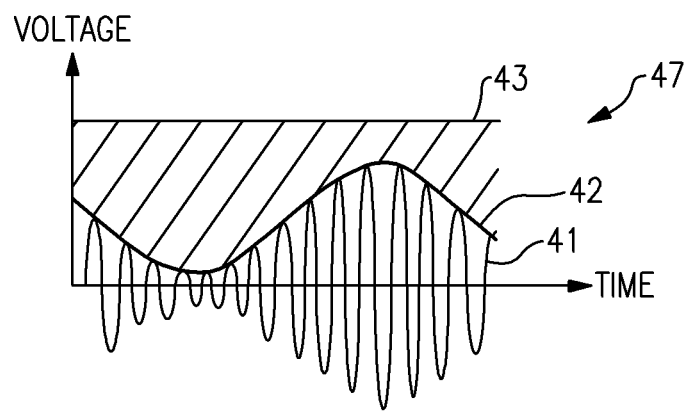
FIGS. 4A-4B show two examples of power supply voltage versus time.
Figure 4B:
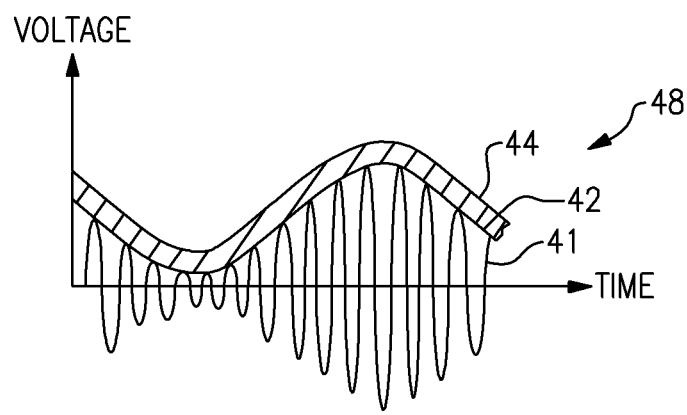

FIGS. 4A-4B show two examples of power supply voltage versus time.

In FIG. 4A, a graph 47 illustrates the voltage of a RF signal 41 and a power amplifier supply voltage 43 versus time. The RF signal 41 has an envelope 42.

It can be important that the power supply voltage 43 of a power amplifier has a voltage greater than that of the RF signal 41. For example, providing a power supply voltage to a power amplifier having a magnitude less than that of the RF signal 41 can clip the RF signal, thereby creating signal distortion and/or other problems. Thus, it can be important that the power supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a mobile device.

In FIG. 4B, a graph 48 illustrates the voltage of an RF signal 41 and a power amplifier supply voltage 44 versus time. In contrast to the power amplifier supply voltage 43 of FIG. 4A, the power amplifier supply voltage 44 of FIG. 4B varies in relation to the envelope 42 of the RF signal 41. The area between the power amplifier supply voltage 44 and the envelope 42 in FIG. 4B is less than the area between the power amplifier supply voltage 43 and the envelope 42 in FIG. 4A, and thus the graph 48 of FIG. 4B can be associated with a power amplifier system having greater energy efficiency.

Overview of Power Amplifiers in a Star Configuration

An envelope tracker can be used to change a power amplifier supply voltage based on an envelope signal to improve the efficiency of a power amplifier system. It can be important to reduce the capacitive load of an envelope tracker or other supply control module. For example, the size and/or cost of an envelope tracker can increase as the load capacitance of the modulator increases.

The problems associated with capacitive loading of an envelope tracker can be exacerbated when envelope tracking is utilized in a power amplifier system having multiple power amplifiers. For example, in a multi-band and/or multi-mode implementation a power amplifier system can be configured to operate using, for example, five or more frequency bands. To reduce cost and/or to improve efficiency, the multi-band and/or multi-mode system can include an envelope tracker configured to control the voltage level of a power supply provided to several power amplifiers. In such a configuration, the capacitance of each power amplifier can load the envelope tracker. Additionally, the power amplifiers can have an on-state and off-state capacitance that can vary by a wide margin, which can increase the worst case loading of the envelope tracker.

Conventional power amplifier systems can include relatively large bypass capacitors connected local to each power amplifier's power supply. For example, with reference back to FIG. 3, relatively large bypass or decoupling capacitors 36 can be employed local to an RF choke or inductor 37 used to provide a power supply to a power amplifier. The bypass capacitors can aid in stabilizing the voltage provided to the power amplifier and can improve the operation of the power amplifier system, including system linearity and stability.

Although bypass capacitors can provide certain benefits to a power amplifier system, employing bypass capacitors in a power amplifier system using envelope tracking can increase the capacitive load of the envelope tracker, which can lead to the envelope tracker being large, consuming a relatively large amount of power, and/or exhibiting instability or degraded performance. Since the envelope tracker may already have a relatively large capacitive load, such as a load associated with a capacitance of transistor devices of the power amplifiers, it may not be possible for a power amplifier system to include relatively large bypass capacitors while meeting other performance specifications.

However, omitting the bypass capacitors can reduce system performance and may even render the power amplifier system non-operational over all or some operating conditions. For example, a power amplifier system may need to operate under a varying voltage standing wave ratio (VSWR). In certain implementations, the VSWR of a power amplifier system can vary by a factor of six or more times. Removal of the bypass capacitors can result in the power amplifier system exhibiting undesirable oscillations or instability when the VSWR is varied.

In certain implementations described herein, power amplifier systems are provided having power amplifier supply inputs or nodes that are electrically connected in a star configuration, in which each supply input is electrically connected to a common star node. By electrically connecting the power amplifiers in this manner, the capacitive loading on an envelope tracker driving the star node can be relatively small. Additionally, a distributed capacitance associated with the star connection, including the capacitance of disabled and/or enabled power amplifiers, can be used to provide RF signal grounding. For example, electrically connecting the power amplifier supply nodes in a star configuration can provide the power amplifiers with a distributed capacitance sufficient for the power amplifiers to adequately function over varying VSWR and other system parameters, while reducing a size of or eliminating the use of bypass capacitors. Accordingly, power amplifier systems having reduced cost and/or improved power efficiency can be employed in, for example, multi-band and/or multi-mode wireless devices.

Figure 5:
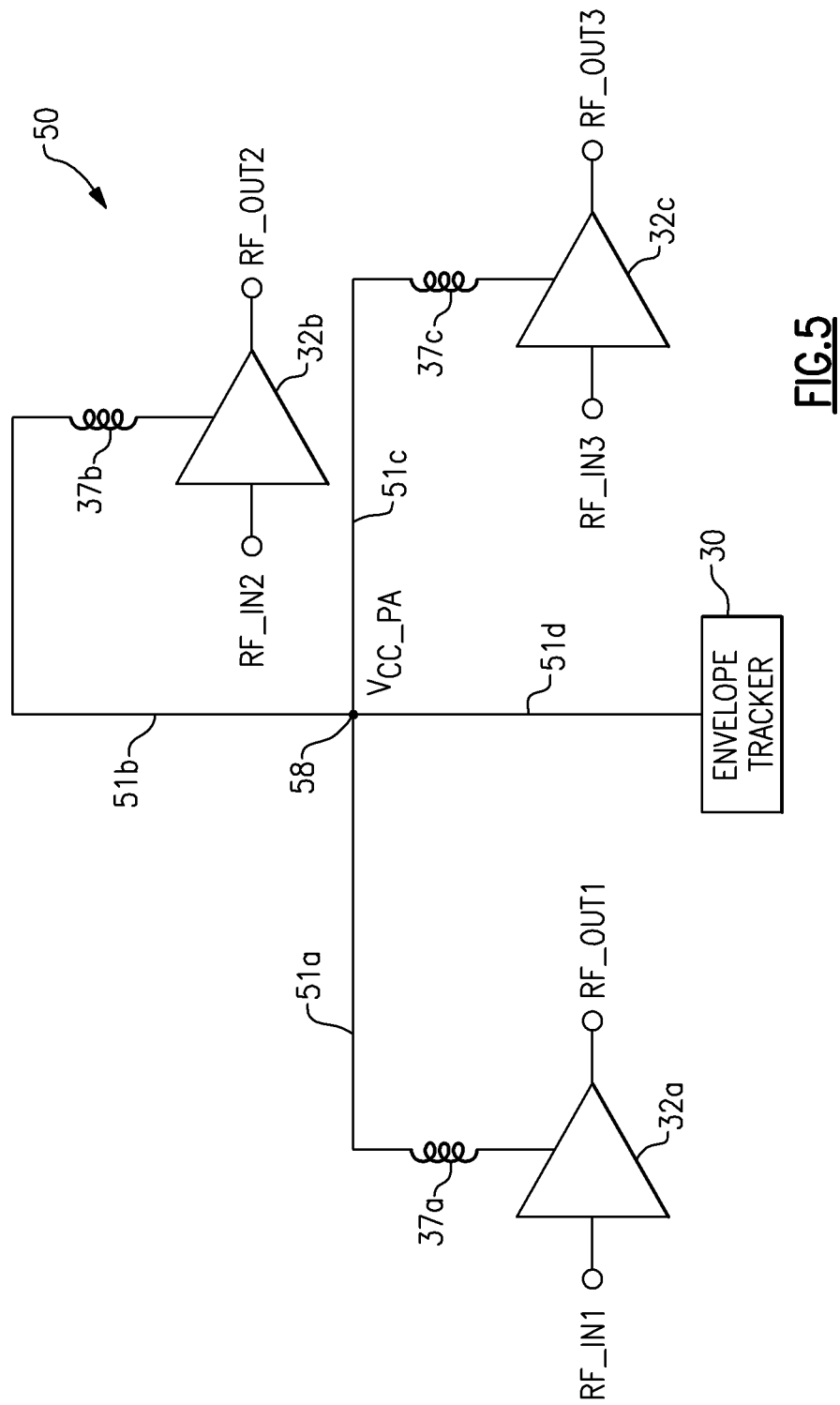
FIG. 5 is a schematic diagram of one embodiment of a power amplifier system.

FIG. 5 is a schematic diagram of one embodiment of a power amplifier system 50. The power amplifier system 50 includes the envelope tracker 30, first to third power amplifiers 32a-32c, and first to third inductors 37a-37c.

The first power amplifier 32a is configured to amplify a first RF signal RF_IN1 to generate a first amplified RF signal RF_OUT1. Additionally, the second power amplifier 32b is configured to amplify a second RF signal RF_IN2 to generate a second amplified RF signal RF_OUT2. Furthermore, the third power amplifier 32c is configured to amplify a third RF signal RF_IN3 to generate a third amplified RF signal RF_OUT3. The power amplifier system 50 can be implemented in a multi-band and/or multi-mode wireless device. The first to third power amplifiers 32a-32d can each be single or multi-stage power amplifiers using any suitable configuration, including, for example, field-effect and/or bipolar transistor configurations. Although FIG. 5 illustrates a configuration using three power amplifiers 32a-32c, the power amplifier system 50 can include more or fewer power amplifiers. In one embodiment, the number of power amplifiers electrically powered using a star configuration is selected to be in the range of about 2 to about 6 power amplifiers, or more particularly, in the range of about 3 to about 5 power amplifiers.

The first to third inductors 37a-37c can be used to electrically power the first to third power amplifiers 32a-32c, respectively, with the power supply voltage $V_{CC\_PA}$ generated from the envelope tracker 30. For example, the first to third inductors 37a-37c can provide a relatively low impedance to the power supply voltage $V_{CC\_PA}$ while blocking high frequency RF signal components associated with the first, second and third amplified RF signals RF_IN1, RF_IN2, and RF_IN3, respectively.

A star network has been used to electrically connect the supply inputs or nodes of the first to third power amplifiers 32a-32c to the envelope tracker 30. For example, a first portion of interconnect 51a has been used to electrically connect the first inductor 37a to a star node 58. Additionally, a second portion of interconnect 51b has been used to electrically connect the second inductor 37b to the star node 58, and a third portion of interconnect 51c has been used to electrically connect the third inductor 37c to the star node 58. As shown in FIG. 5, the first to third portions of interconnect 51a-51c have been configured to meet at the star node 58. Additionally, a fourth portion of interconnect 51d has been used to electrically connect the envelope tracker 30 to the star node 58.

Connecting the power amplifiers 32a-32c in a star configuration can aid in reducing the capacitive loading of the envelope tracker 30, since the star network associated with the power supply voltage $V_{CC\_PA}$ can have relatively small or no bypass capacitors. Thus, rather than employing relatively large bypass capacitors local to the supply nodes of each of the first to third power amplifiers 32a-32c, a distributed capacitance associated with the star network, including a capacitance of the power amplifiers 32a-32c, can be used to provide RF grounding to RF signals and/or noise that reaches the star node 58. Thus, the star network can allow the envelope tracker 30 to have a relatively small size and/or relatively low cost, while providing a sufficiently a low impedance path to high frequency signals, thereby reducing the noise of the power amplifier supply voltage $V_{CC\_PA}$ and improving the performance of the first to third inductors 37a-37c as RF chokes.

In certain implementations described herein, a power amplifier supply is configured as a star network to reduce the effective capacitance of an envelope tracker in a multiple power amplifier system to be less than or equal to about 250 pF. Thus, highly efficient and low cost power amplifier systems can be provided for use in multi-band and/or multi-mode wireless devices.

The first, second and third inductors 37a-37c can be sized in any suitable manner. For example, the first, second, and third inductors 37a-37c can be sized so as to prevent a capacitance associated with the envelope tracker 30 from resonating with the inductors 37a-37c. For example, an inductor-capacitor (LC) network can resonate at an angular frequency about equal to the inverse of the square root of the product of the inductance and the capacitance of the network. In certain implementations, the first, second, and third inductors 37a-37c are sized so as to prevent the star network from resonating at frequencies associated with the modulation bandwidth of the envelope tracker 30. For example, the resonance of the star network can be selected to be greater than about 3 to about 5 times the modulation bandwidth of the envelope tracker 30. In one embodiment, the first to third inductors 37a-37c each have an inductance selected to be in the range of about 0.5 nH to about 4 nH.

Figure 6:
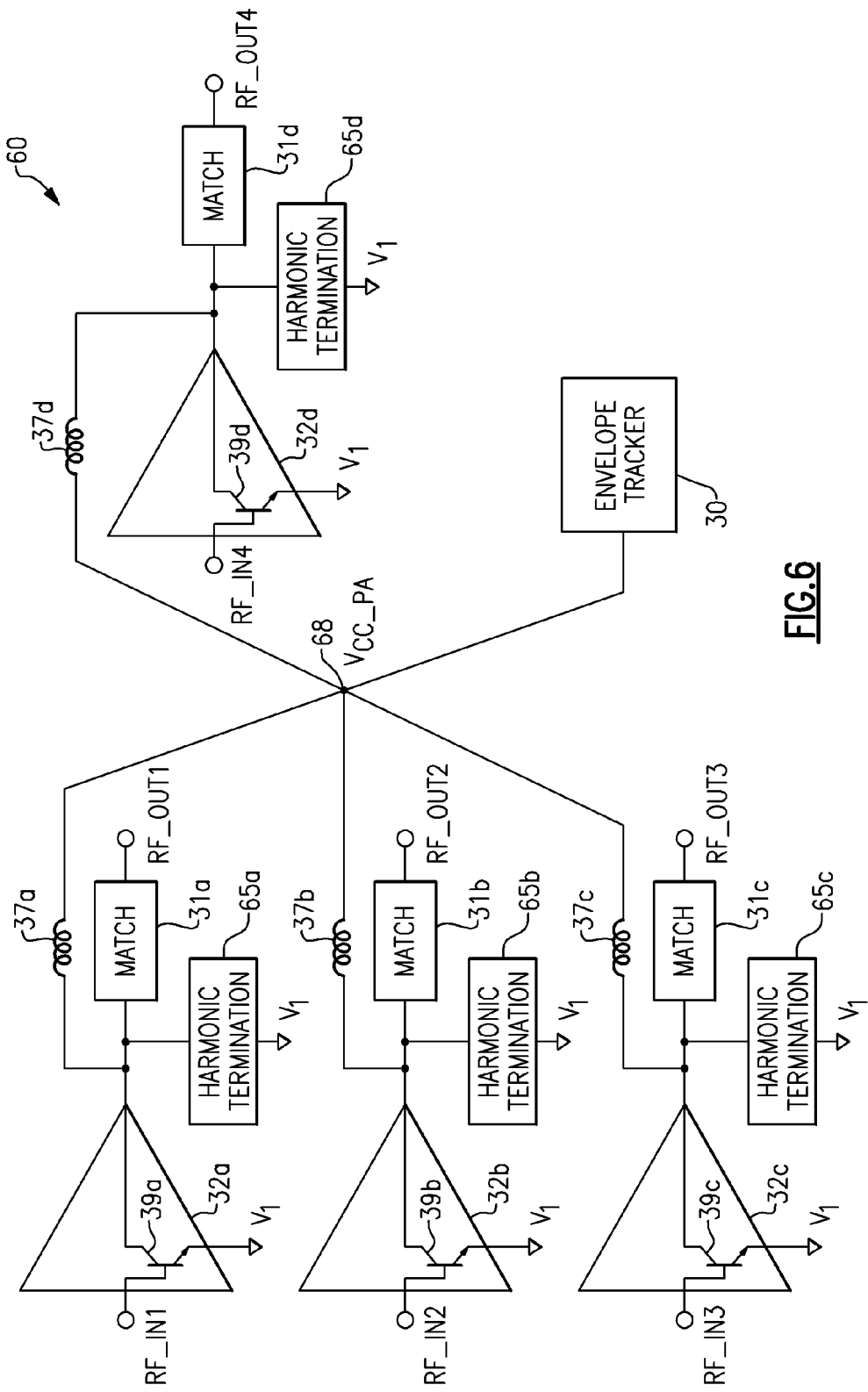
FIG. 6 is a schematic diagram of another embodiment of a power amplifier system.

FIG. 6 is a schematic diagram of another embodiment of a power amplifier system 60. The power amplifier system 60 includes the envelope tracker 30, first to fourth impedance matching blocks 31a-31d, first to fourth power amplifiers 32a-32d, first to fourth inductors 37a-37d, and first to fourth harmonic termination blocks 65a-65d.

The first power amplifier 32a is configured to amplify a first RF signal RF_IN1 to generate a first amplified RF signal RF_OUT1. Additionally, the second power amplifier 32b is configured to amplify a second RF signal RF_IN2 to generate a second amplified RF signal RF_OUT2. Furthermore, the third power amplifier 32c is configured to amplify a third RF signal RF_IN3 to generate a third amplified RF signal RF_OUT3. Additionally, the fourth power amplifier 32d is configured to amplify a fourth RF signal RF_IN4 to generate a fourth amplified RF signal RF_OUT4. Although FIG. 6 illustrates a configuration using four power amplifiers 32a-32d, the power amplifier system 60 can be adapted to include more or fewer power amplifiers.

Each of the first to fourth power amplifiers 32a-32d includes a bipolar transistor for providing amplification in a manner similar to that described earlier with respective to FIG. 3. For example, the first to fourth power amplifiers 32a-32d can include the first to fourth bipolar transistors 39a-39d, respectively. The emitters of the first to fourth bipolar transistors 39a-39d can each be electrically connected to the first voltage reference $V_1$, and the bases of the first to fourth bipolar transistors 39a-39d can be configured to receive the first to fourth RF signals RF_IN1 to RF_IN4, respectively. Additionally, the collectors of the first to fourth bipolar transistors 39a-39d can be electrically connected to first to fourth impedance matching blocks 31a-31d, respectively, and to the first to fourth harmonic termination blocks 65a-65d, respectively. The first to fourth harmonic termination blocks 65a-65d can be used to provide a low impedance path at one or more harmonics of the fundamental frequency of the RF signals amplified by the power amplifiers 32a-32d, respectively. Including the first to fourth harmonic termination blocks 65a-65d in the power amplifier system 60 can improve the performance of the power amplifier system 60 by improving power amplifier stability and/or by improving the signal-to-noise ratio of RF signals generated using the power amplifier system 60.

The first to fourth inductors 37a-37d have been used to provide the first to fourth power amplifiers 32a-32d with the power supply voltage $V_{CC\_PA}$ generated by the envelope tracker 30. The power supply voltage $V_{CC\_PA}$ has been provided to the power amplifiers 32a-32d using a star network. For example, the first inductor 37a includes a first end electrically connected to the collector of the first bipolar transistor 39a and a second end electrically connected to a star node 68. Additionally, the second inductor 37b includes a first end electrically connected to the collector of the second bipolar transistor 39b and a second end electrically connected to the star node 68. Furthermore, the third inductor 37c includes a first end electrically connected to the collector of the third bipolar transistor 39c and a second end electrically connected to the star node 68. Additionally, the fourth inductor 37d includes a first end electrically connected to the collector of the fourth bipolar transistor 39d and a second end electrically connected to the star node 68. Furthermore, the envelope tracker 30 is electrically connected to the star node 68.

Electrically powering the first to fourth power amplifiers 32a-32d using a star network can reduce capacitive loading of the envelope tracker 30 while providing a distributed capacitance that can operate as an RF ground for each of the power amplifiers 32a-32d. For example, whether or not the power amplifiers 32a-32d are disabled or enabled, the bipolar transistors 39a-39d can have a capacitive component from the perspective of RF signals reaching the star node 68. For example, the bipolar transistors 39a-39d can each have a collector-base capacitance that can be relatively large, and which can increase due to the Miller effect when the power amplifier is enabled. Furthermore, the first to fourth impedance matching blocks 31a-31d and/or the first to fourth harmonic termination blocks 65a-65d can have an associated capacitance.

Accordingly, the star network can have a distributed capacitance, which can operate as a RF ground to signals reaching the star node 68. Thus, the star network can provide a relatively low impedance path to RF signals, thereby reducing or eliminating the need for relatively large bypass capacitors local to each of the first to fourth power amplifiers 32a-32d.

Although the first to fourth impedance matching blocks 31a-31d, the first to fourth inductors 37a-37d, and the first to fourth harmonic termination blocks 65a-65d have been illustrated in FIG. 6 as separate blocks, persons having ordinary skill in the art will appreciate that each of these blocks can be collectivity tuned so as to achieve a desired impedance versus frequency characteristic for each of the first to fourth power amplifiers 32a-32d. For example, the first to fourth impedance matching blocks 31a-31d, the first to fourth inductors 37a-37d, and the first to fourth harmonic termination blocks 65a-65d can be tuned to achieve a desired impedance for the collectors of the first to fourth bipolar transistors 39a-39d, including a desired impedance at a fundamental frequency and/or one or more harmonic frequencies.

Figure 7:
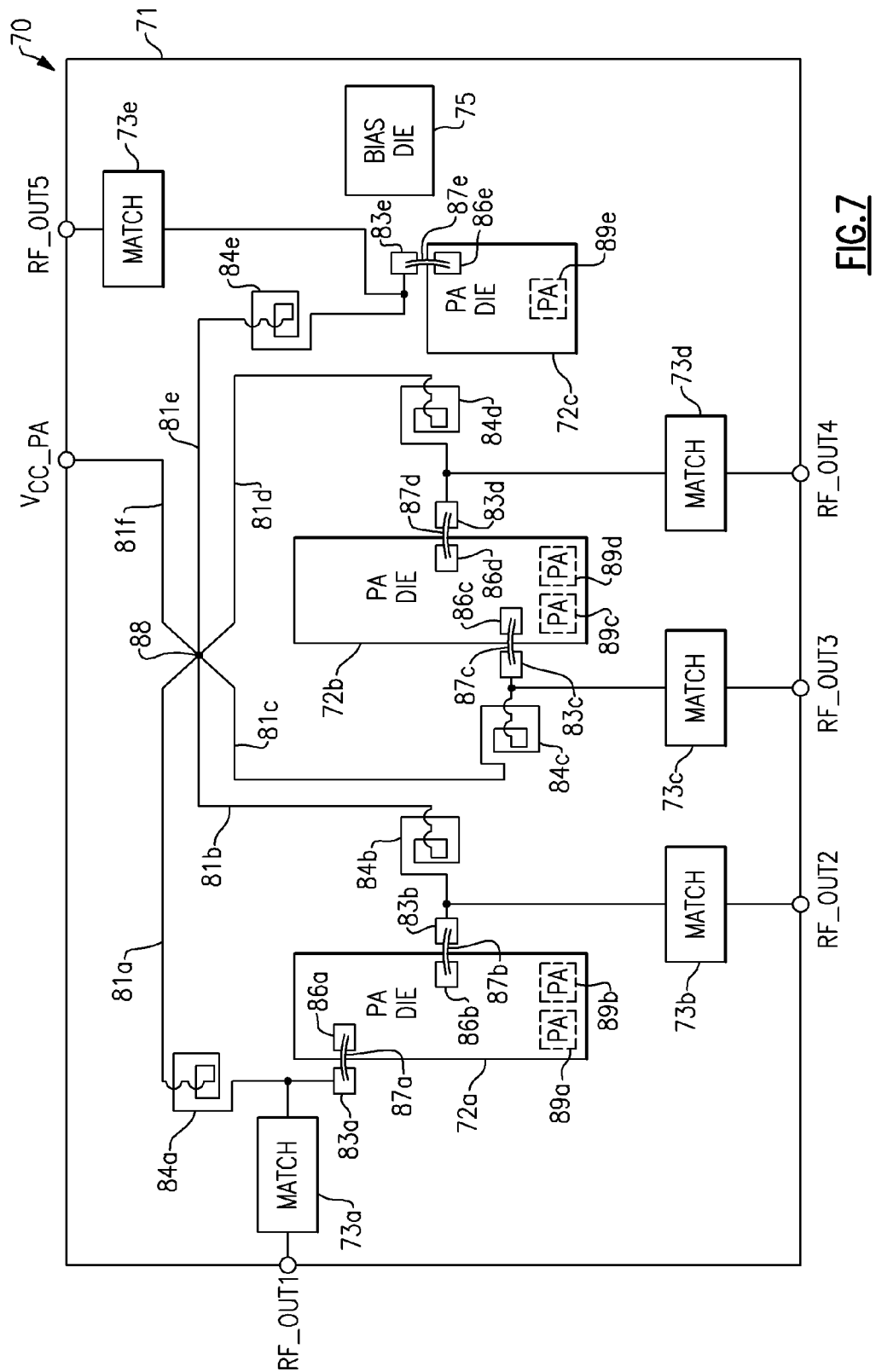
FIG. 7 is a schematic diagram of one embodiment of a multi-chip module (MCM).

FIG. 7 is a schematic diagram of one embodiment of a multi-chip module (MCM) 70. The illustrated MCM 70 includes a substrate 71, first to third power amplifier dies 72a-72c, first to fifth impedance matching networks 73a-73e, and a bias die 75.

The MCM 70 further includes a power supply pin $V_{CC\_PA}$, a first output pin RF_OUT1, a second output pin RF_OUT2, a third output pin RF_OUT3, a fourth output pin RF_OUT4, and a fifth output pin RF_OUT5. Although FIG. 7 illustrates a configuration having five output pins, the MCM 70 can be adapted to include more or fewer output pins. Additionally, although not illustrated in FIG. 7 for clarity, the MCM 70 can include additional pins, such as one or more input pins, control pins, harmonic termination pins, ground pins and/or other supply pins, including, for example, a supply pin associated with power amplifier input stages.

The MCM 70 can be included in a wireless device to provide amplification of RF signals. For example, the MCM 70 can be mounted on a phone board of the wireless device, and the pins of the MCM 70 can be used to communicate between the MCM 70 and other components of the wireless device. In certain implementations, the wireless device can include an envelope tracker, which can be mounted on the phone board and electrically connected to the power supply pin $V_{CC\_PA}$ of the MCM 70. However, other configurations are possible, such as implementations in which an envelope tracking die is disposed on the MCM 70.

The first to third power amplifier dies 72a-72c can each include one or more power amplifiers that can be used to amplify RF signals. For example, the first power amplifier die 72a can include a first power amplifier 89a and a second power amplifier 89b, the second power amplifier die 72b can include a third power amplifier 89c and a fourth power amplifier 89d, and the third power amplifier die 72c can include a fifth power amplifier 89e. The first to fifth power amplifiers 89a-89e can each be single or multi-stage power amplifiers. By including a plurality of power amplifiers 89a-89e on the MCM 70 across one or more power amplifier dies, the MCM 70 can be configured to provide, for example, power efficient amplification for multiple RF signal bands. For example, the first to fifth power amplifiers 89a-89e can be power amplifiers optimized for amplification of W-CDMA Band I, W-CDMA Band II, W-CDMA Band V, W-CDMA Band VIII, and W-CDMA Band IV, respectively. Although FIG. 7 illustrates one possible distribution of the power amplifiers 89a-89e across power amplifier dies, other configurations can be used, including, for example, configurations in which only a single power amplifier die is employed.

The first to third power amplifier dies 72a-72c can include pads that can be used to electrically connect the power amplifiers 89a-89e to pins and/or components of the MCM 70. For example, in the illustrated configuration, the first power amplifier die 72a includes a first pad 86a and a second pad 86b, the second power amplifier die 72b includes a third pad 86c and a fourth pad 86d, and the third power amplifier die 72c includes a fifth pad 86e. Although not illustrated for clarity, each of the first to third power amplifier dies 72a-72c can include additional pads for other signal, ground, and power connections.

Each of the first to fifth pads 86a-86e can be electrically connected to an output of a different power amplifier. For example, the first to fifth pads 86a-86e can be electrically connected to an output of the first to fifth power amplifiers 89a-89e, respectively. In certain configurations, the output of each of the first to fifth power amplifiers 89a-89e is associated with a collector of a bipolar transistor used for amplification, and thus can operate as both a power supply input and as an output for an amplified RF signal.

The substrate 71 can be a multi-layer laminate. For example, the substrate 71 can include a plurality of alternating conductive layers and non-conductive layers laminated together with vias providing interconnectivity between adjacent conductive layers. Providing a multi-layer substrate 71 can aid in achieving a desired connectivity of the MCM 70. Various structures can be formed on or in the substrate 71, including first to fifth inductors 84a-84e, first to fifth pads 83a-83e, and first to sixth traces 81a-81f. Although not illustrated in FIG. 7, the substrate 71 can include structures in addition to those shown.

The first to third power amplifier dies 72a-72c have been mounted on the substrate 71, and bond wires have been used to provide interconnection between the pads 86a-86e of the power amplifier dies 72a-72c and the pads 83a-83e of the package substrate 71. For example, a first bond wire 87a includes a first end electrically connected to the first pad 86a of the first power amplifier die 72a and a second end electrically connected to the first pad 83a of the package substrate 71. Additionally, a second bond wire 87b includes a first end electrically connected to the first pad 86b of the first power amplifier die 72a and a second end electrically connected to the second pad 83b of the package substrate 71. Furthermore, a third bond wire 87c includes a first end electrically connected to the third pad 86c of the second power amplifier die 72b and a second end electrically connected to the third pad 83c of the substrate 71. Additionally, a fourth bond wire 87d includes a first end electrically connected to the fourth pad

86*d* of the second power amplifier die 72*b* and a second end electrically connected to the fourth pad 83*d* of the substrate 71. Furthermore, a fifth bond wire 87*e* includes a first end electrically connected to a fifth pad 86*e* of the third power amplifier die 72*c* and a second end electrically connected to the fifth pad 83*e* of the substrate 71.

The first to fifth inductors 84*a*-84*e* can be used to provide a voltage received on the power supply pin $V_{CC\_PA}$ to the first to fifth power amplifiers 89*a*-89*e* while choking or blocking high frequency RF signal components. In the illustrated configuration, the first to fifth inductors 84*a*-84*e* have been formed from trace of one or more layers of the substrate 71 of the MCM 70. Although the first to fifth inductors 84*a*-84*e* can be formed from substrate trace, in other implementations, one or more of the first to fifth inductors 84*a*-84*e* can be formed in all or in part from other inductive structures, including, for example, surface mount components and/or bond wires.

The first to fifth impedance matching networks 73*a*-73*e* can be used to aid in terminating the electrical connections between the first to fifth power amplifiers 89*a*-89*e* and the first to fifth output pins RF_OUT1, RF_OUT2, RF_OUT3, RF_OUT4, and RF_OUT5, respectively. For example, the first impedance matching network 73*a* is electrically connected between the first output pin RF_OUT1 and the first pad 83*a*, and can be used to terminate the output of the first power amplifier 89*a*. Additionally, the second impedance matching network 73*b* is electrically connected between the second output pin RF_OUT2 and the second pad 83*b*, and can be used to terminate the output of the second power amplifier 89*b*. Furthermore, the third impedance matching network 73*c* is electrically connected between the third output pin RF_OUT3 and the third pad 83*c*, and can be used to terminate the output of the third power amplifier 89*c*. Additionally, the fourth impedance matching network 73*d* is electrically connected between the fourth output pin RF_OUT4 and the fourth pad 83*d*, and can be used to terminate the output of the fourth power amplifier 89*d*. Furthermore, the fifth impedance matching network 73*e* is electrically connected between the fifth output pin RF_OUT5 and the fifth pad 83*e*, and can be used to terminate the output of the fifth power amplifier 89*e*. In certain configurations, first to fifth impedance matching networks 73*a*-73*e* can also be configured to achieve a desired load line impedance for the power amplifiers 89*a*-89*e*, respectively.

The first to fifth impedance matching networks 73*a*-73*e* can each include an inductive component and a capacitive component. The inductive component can be formed, for example, using trace of the substrate 71, using one or more bond wires, and/or using one or more surface mount components. The capacitive component can be formed, for example, using one or more surface mount components.

The power amplifier bias die 75 can be mounted on the substrate 71, and can be used, for example, to enable and disable one or more of the power amplifiers 89*a*-89*e* and/or to provide bias signals to the power amplifiers 89*a*-89*e*. For example, in a bipolar transistor configuration, the power amplifier bias die 75 can be used to provide one or more reference voltages for biasing current mirrors used to generate base currents for the power amplifiers.

The first to fifth power amplifiers 89*a*-89*e* are electrically powered using a star configuration. For example, the first to fifth power amplifiers 89*a*-89*e* are supplied with a voltage received on the power supply pin $V_{CC\_PA}$ using the first to fifth inductors 84*a*-84*e*, respectively, which are electrically connected to a star node 88 using the first to fifth traces 81*a*-81*e*, respectively. For example, the first trace 81*a* has been used to electrically connect the first inductor 84*a* to the star node 88, the second trace 81*b* has been used to electrically connect the second inductor 84*b* to the star node 88, the third trace 81*c* has been used to electrically connect the third inductor 84*c* to the star node 88, the fourth trace 81*d* has been used to electrically connect the fourth inductor 84*d* to the star node 88, and the fifth trace 81*e* has been used to electrically connect the fifth inductor 84*e* to the star node 88. Additionally, a sixth trace 81*f* has been used to electrically connect the power supply pin $V_{CC\_PA}$ to the star node 88, thereby allowing an envelope tracker to power the first to fifth power amplifiers 89*a*-89*e*.

By electrically connecting the first to fifth power amplifiers 89*a*-89*e* in this manner, the distributed capacitance associated with the star node 88, including the capacitance associated with any disabled power amplifiers, can be used to provide RF ground. Thus, the operation of the power amplifier system can be maintained while avoiding or reducing the size of bypass capacitors, thereby providing a relatively small capacitive loading to an envelope tracker driving the power supply pin $V_{CC\_PA}$.

The first to sixth traces 81*a*-81*f* have been electrically connected to the star node 88 to aid in biasing the first to fifth power amplifiers 89*a*-89*e* in a star configuration. Although the star node 88 is illustrated as a single point in FIG. 7, when implemented the star network on and/or in the substrate 71, the first to sixth traces 81*a*-81*f* associated with the star network may not meet precisely at a single point. Rather, the first to sixth traces 81*a*-81*f* can meet within a relatively small area of the substrate 71. In one embodiment, the star node 88 is contained within an area of the substrate 71 of the MCM 70 that is less than about 0.16 mm$^2$.

The first to fifth traces 81*a*-81*e* can have any suitable length between the star node 88 and the first to fifth inductors 84*a*-84*e*, respectively. For example, in some implementations, the first to fifth traces 81*a*-81*f* each have a length in the range of about 500 μm to about 5,000 μm. Although the first to fifth traces 81*a*-81*e* can be configured to have relatively similar lengths, the first to fifth traces 81*a*-81*e* need not have the same length. Additionally, the sixth trace 81*f* can have a length different than that of the first to fifth traces 81*a*-81*e*. For example, in certain implementations, the sixth trace 81*f* has a relatively short length so as to reduce a length of interconnect between an envelope tracker and the star node 88 when the MCM 70 is mounted on a phone board. For example, in some implementations, the sixth trace 81*f* has a length less than about 6,000 μm.

Figure 8:
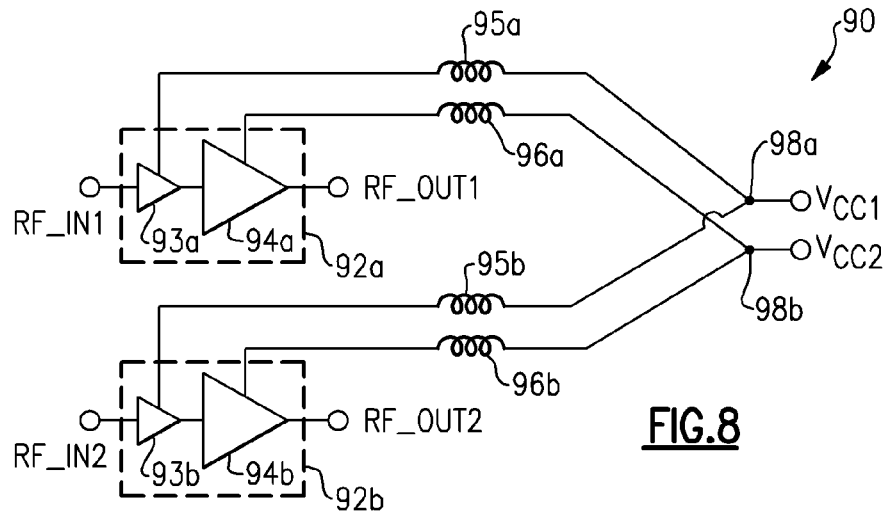
FIG. 8 is a schematic diagram of yet another embodiment of a power amplifier system.

FIG. 8 is a schematic diagram of yet another embodiment of a power amplifier system 90. The power amplifier system 90 includes a first power amplifier 92*a*, a second power amplifier 92*b*, a first input stage inductor 95*a*, a second input stage inductor 95*b*, a first output stage inductor 96*a*, and a second output stage inductor 96*b*.

The first and second power amplifiers 92*a*, 92*b* are each multi-stage power amplifiers. For example, the first power amplifier 92*a* includes a first input stage 93*a* and a first output stage 94*a*, and the second power amplifier 92*b* includes a second input stage 93*b* and a second output stage 94*b*. Using a plurality of stages in a power amplifier can help reduce the design constraints of the power amplifier relative to a design employing a single stage.

In the illustrated configuration, the input and output stages of the first and second power amplifiers 92*a*, 92*b* have been electrically powered using different star networks. For example, the first input stage inductor 95*a* is electrically connected between a supply input of the first input stage 93*a* and a first star node 98*a*, and the second input stage inductor 95*b* is electrically connected between a supply input of the second input stage 93b and the first star node 98a. The first star node 98a can be configured to receive a first power amplifier supply voltage $V_{CC1}$, which in some implementations is generated using an envelope tracker. However, other implementations are possible, as will be described further below with reference to FIGS. 10A-10C. Additionally, the first output stage inductor 96a is electrically connected between a supply input of the first output stage 94a and a second star node 98b, and the second output stage inductor 96b is electrically connected between a supply input of the second output stage 94b and the second star node 98b. The second star node 98b can be configured to receive a second power amplifier supply voltage $V_{CC2}$, which in some implementations is generated using an envelope tracker or other suitable supply voltage modulator.

As shown in FIG. 8, the input and output stages of the power amplifiers 92a, 92b are electrically powered using separate star networks. In other implementations, only the output stages of the power amplifiers are electrically connected in a star configuration. In some other implantations, both the input stages and output stages of the power amplifiers are electrically powered using a common star network. Although the power amplifier system 90 is illustrated as including two power amplifiers 92a, 92b, the power amplifier system 90 can be adapted to include additional power amplifiers.

Figure 9:
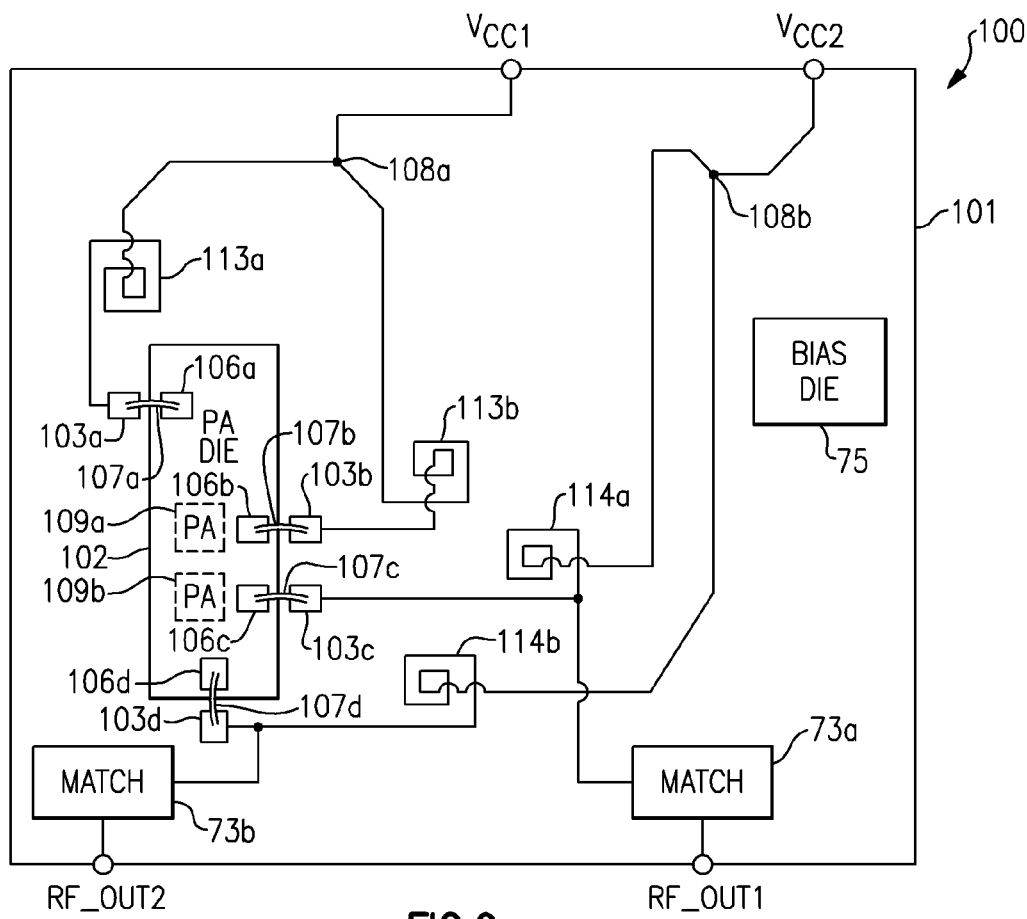
FIG. 9 is a schematic diagram of another embodiment of an MCM.

FIG. 9 is a schematic diagram of another embodiment of an MCM 100. The MCM 100 includes a substrate 101, a power amplifier die 102, the first impedance matching network 73a, the second impedance matching network 73b, and the bias die 75. The MCM 100 further includes a first power supply pin $V_{CC1}$, a second power supply pin $V_{CC2}$, a first output pin RF_OUT1, and a second output pin RF_OUT2. Although FIG. 9 illustrates a configuration having two output pins, the MCM 100 can be adapted to include additional output pins. Additionally, the MCM 100 typically includes additional pins, such as one or more input pins, control pins, harmonic termination pins, ground pins and/or other supply pins.

The power amplifier die 102 includes a first multi-stage power amplifier 109a and a second multi-stage power amplifier 109b. Additionally, the power amplifier die 102 includes a first pad 106a, a second pad 106b, a third pad 106c, and a fourth pad 106d. Although not illustrated for clarity, the power amplifier die 102 can include additional pads for providing other signal, ground, and power connections. The first pad 106a can be electrically connected to a supply node of an input stage of the first multi-stage power amplifier 109a, and the second pad 106b can be electrically connected to a supply node of an input stage of the second multi-stage power amplifier 109b. Additionally, the third pad 106c can be electrically connected to a supply node of an output stage of the first multi-stage power amplifier 109a, and the fourth pad 106d can be electrically connected to a supply node of an output stage of the second multi-stage power amplifier 109b. The first to fourth pads 106a-106d can aid in connected in the input and output stages of the first and second multi-stage power amplifiers 109a, 109b to star networks formed on the substrate 101, as will be described below.

The substrate 101 includes first and second input stage inductors 113a, 113b, first and second output stage inductors 114a, 114b, first to fourth pads 103a-103d, and traces for interconnecting pins, pads and other components of the MCM 100. In certain implementations, the substrate 101 is a multi-layer laminate including a plurality of alternating conductive layers and non-conductive layers. Although not illustrated in FIG. 9, the substrate 101 can include structures in addition to those shown.

The power amplifier die 102 has been attached to the substrate 101, and bond wires have been used to provide interconnection between the pads 106a-106d of the power amplifier die 102 and the pads 103a-103d of the package substrate 101. For example, a first bond wire 107a is electrically connected between the first pad 103a of the substrate 101 and the first pad 106a of the power amplifier die 102, a second bond wire 107b is electrically connected between the second pad 103b of the substrate 101 and the second pad 106b of the power amplifier die 102, a third bond wire 107c is electrically connected between the third pad 103c of the substrate 101 and the third pad 106c of the power amplifier die 102, and a fourth bond wire 107d is electrically connected between the fourth pad 103d of the substrate 101 and the fourth pad 106d of the power amplifier die 102.

The first and second input stage inductors 113a, 113b can be used to provide a voltage received on the first power supply pin $V_{CC1}$ to the input stages of the first and second multi-stage power amplifiers 109a, 109b. Additionally, the first and second output stage inductors 114a, 114b can be used to provide a voltage received on the second power supply pin $V_{CC2}$ to the output stages of the first and second multi-stage power amplifiers 109a, 109b. In the illustrated configuration, the first and second input stage inductors 113a, 113b and the first and second output stage inductors 114a, 114b are formed from trace associated with one or more layers of the substrate 101. However, other configurations are possible.

The input and output stages of the first and second multi-stage power amplifiers 109a, 109b are each electrically powered using a star network. For example, the first power supply pin $V_{CC1}$ has been electrically connected to a first star node 108a using trace of the substrate 101, and the first and second input stage inductors 113a, 113b have been connected between the first star node 108a and the input stages of the first and second multi-stage power amplifiers 109a, 109b, respectively. Additionally, the second power supply pin $V_{CC2}$ has been electrically connected to a second star node 108a using trace of the substrate 101, and the first and second output stage inductors 114a, 114b have been connected between the second star node 108b and the output stages of the first and second multi-stage power amplifiers 109a, 109b, respectively. Additional details of the star networks can be similar to those described earlier.

The first and second impedance matching networks 73a, 73b can be used to terminate the electrical connections between the outputs of the first and second multi-stage power amplifiers 109a, 109b and the first and second output pins RF_OUT1, RF_OUT2, respectively. For example, the first impedance matching network 73a is electrically connected between the third pad 103c and first output pin RF_OUT1, and the second impedance matching network 73b is electrically connected between the fourth pad 103d and the second output pin RF_OUT2. Additional details of the first and second impedance matching networks 73a, 73b can be similar to those described earlier.

The power amplifier bias die 75 can be included on the MCM substrate 100, and can be used, for example, to enable and disable one or more of the multi-stage power amplifiers 109a, 109b and/or to provide bias signals to the multi-stage power amplifiers 109a, 109b. For example, the power amplifier die 75 can generate signals for biasing the input and/or output stages of the first and second multi-stage power amplifiers 109a, 109b.

Although FIG. 9 illustrates one example of the electrical connectivity of the power supply nodes of multi-stage power amplifiers, other configurations are possible. For example, in one embodiment, the first and second star nodes 108a, 108b are electrically connected to one another on the substrate 101. In another implementation, the first star node 108a is omitted in favor of electrically connecting a series combination of the first input stage inductor 113a and a first surface mount inductor between the first pad 103a and the second star node 108b and electrically connecting a series combination of the second input stage inductor 113b and a second surface mount inductor between the second pad 103b and the second star node 108b.

Figure 10A:
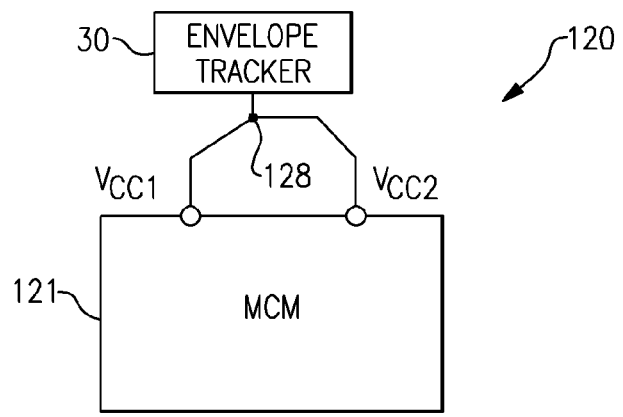
FIGS. 10A-10C are schematic diagrams of various embodiments of portions of phone boards.
Figure 10B:
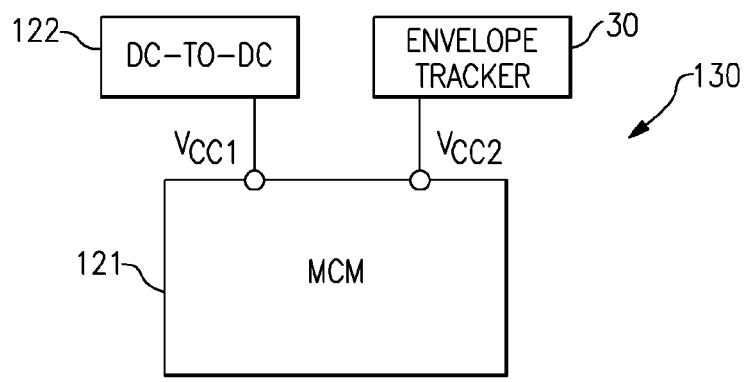
Figure 10C:
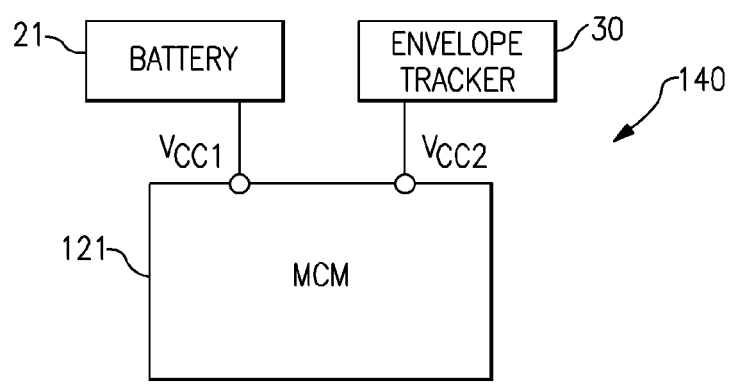

FIGS. 10A-10C are schematic diagrams of various embodiments of portions of phone boards.

FIG. 10A is a schematic diagram of a first embodiment of a portion of a phone board 120 that can be used with an MCM 121 that includes a first power supply pin $V_{CC1}$ and a second power supply pin $V_{CC2}$. The MCM 121 can be similar to, for example, the MCM 100 of FIG. 9. Thus, the first and second power supply pins $V_{CC1}$, $V_{CC2}$ can be associated with star networks of input and output stages, respectively, of multi-stage power amplifiers. In the illustrated configuration, the phone board 120 includes an envelope tracker 30 electrically connected to a star node 128 using a first portion of phone board trace. Additionally, the first and second power supply pins $V_{CC1}$, $V_{CC2}$ have been electrically connected to the star node 128 using a second portion and a third portion of phone board trace, respectively.

In the configuration shown in FIG. 10A, both the first and second power supply pins $V_{CC1}$, $V_{CC2}$ have been electrically connected to the envelope tracker 30. However, rather than electrically connected the first power supply pin $V_{CC1}$ to the second power supply pin $V_{CC2}$ within the MCM 121, the first and second power supply pins $V_{CC1}$, $V_{CC2}$ have been electrically connected on the phone board 120. Connecting the supplies on the phone board 120 can help prevent noise associated with the power amplifier output stages from being injected into the power amplifier input stages. For example, the envelope tracker 30 can have a capacitance that can aid in grounding RF signals that reach the star node 128 of the phone board 120. The capacitance of the envelope tracker 30 can provide a low impedance path to signals, including low frequency AC signals, RF signals and noise associated with the second power supply pin $V_{CC2}$ that reaches the star node 128, thereby reducing the amount of signal feedback from the second power supply pin $V_{CC2}$ to the first power supply pin $V_{CC1}$. Accordingly, the implementation illustrated in FIG. 10A can provide improved performance relative to a scheme in which the first and second power supply pins $V_{CC1}$, $V_{CC2}$ are electrically connected within the MCM 121.

FIG. 10B is a schematic diagram of a second embodiment of a portion of a phone board 130, which includes the MCM 121, the envelope tracker 30, and a DC-to-DC converter 122. The MCM 121 includes a first power supply pin $V_{CC1}$ and a second power supply pin $V_{CC2}$, which can be electrically connected to star networks associated with power amplifier input and output stages, respectively.

In the illustrated configuration, the first power supply pin $V_{CC1}$ has been electrically connected to the DC-to-DC converter 122 and the second power supply pin $V_{CC2}$ has been electrically connected to the envelope tracker 30. As shown in FIG. 10B, in certain implementations the input and output stages of a multi-stage power amplifier can be powered using different supply control modules.

FIG. 10C is a schematic diagram of a third embodiment of a portion of a phone board 140, which includes the MCM 121, the envelope tracker 30, and the battery 21. The MCM 121 includes a first power supply pin $V_{CC1}$ and a second power supply pin $V_{CC2}$, which can be electrically connected to star networks associated with the power amplifier input and output stages, respectively.

In the illustrated configuration, the first power supply pin $V_{CC1}$ has been electrically connected to the battery 21 and the second power supply pin $V_{CC2}$ has been electrically connected to the envelope tracker 30.

As illustrated in FIGS. 10A-10C, the MCM 121 can be configured to operate in a variety of different phone board implementations. Providing the MCM 121 with star networks for the power supplies of the input and output stages can improve design flexibility of a wireless device. In addition to the variations shown in FIGS. 10A-10C, other configurations are possible. For example, in one implementation, FIG. 10C is modified such that a DC-to-DC converter drives the second power supply pin $V_{CC2}$. Thus, the teachings herein are applicable not only to envelope tracking implementations, but to other implementation as well, including, for example, average power tracking configurations. Furthermore, although FIGS. 10A-10C illustrate a supply control module provide a power supply to a single MCM, a supply control module can be configured to provide a power supply to a plurality of MCMs, including, for example, single band and/or multi-band MCMs. For example, a phone board can include an envelope tracker configured to drive power supply pins of two or more MCMs.

Figure 11:
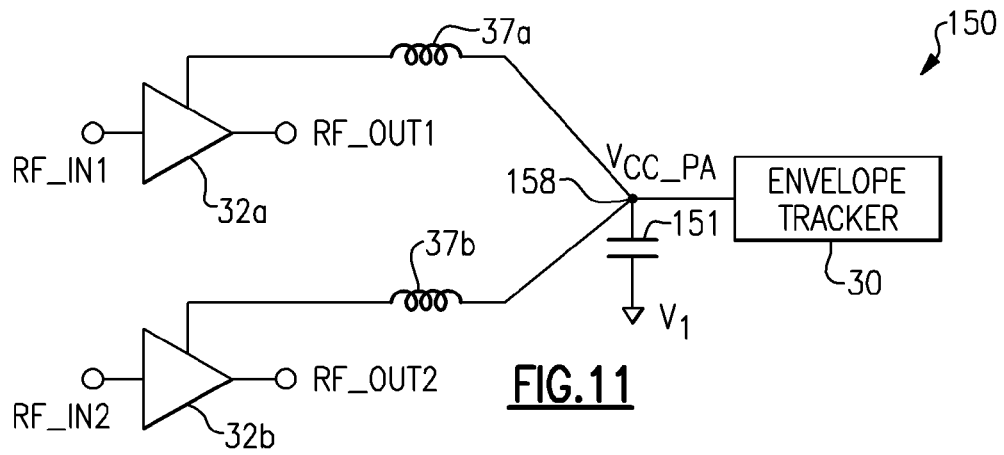
FIG. 11 is a schematic diagram of yet another embodiment of a power amplifier system.

FIG. 11 is a schematic diagram of yet another embodiment of a power amplifier system 150. The power amplifier system 150 includes a first power amplifier 32a, a second power amplifier 32b, a first inductor 37a, a second inductor 37b, a capacitor 151, and an envelope tracker 30.

The first power amplifier 32a is configured to amplify a first RF signal RF_IN1 to generate a first amplified RF signal RF_OUT1. Additionally, the second power amplifier 32b is configured to amplify a second RF signal RF_IN2 to generate a second amplified RF signal RF_OUT2. The first and second power amplifiers 32a, 32b can each be single or multi-stage power amplifiers using any suitable configuration, including, for example, field-effect and/or bipolar transistor configurations. Although FIG. 11 illustrates an implementation using two power amplifiers, the power amplifier system 150 can be adapted to include more power amplifiers.

In the illustrated configuration, the first and second power amplifiers 32a, 32b have been electrically powered using a star network. For example, the first inductor 37a is electrically connected between a star node 158 and a supply input of the first power amplifier 32a, and the second inductor 37b is electrically connected between the star node 158 and a supply input of the second power amplifier 32b. Additionally, the envelope tracker 30 is electrically connected to the star node 158, and is configured to generate the power amplifier supply voltage $V_{CC\_PA}$.

The capacitor 151 includes a first end electrically connected to the star node 158 and a second end electrically connected to the first voltage reference $V_1$, which can be, for example, a ground node. Including the capacitor 151 can help reduce noise on the power amplifier supply voltage $V_{CC\_PA}$ by providing a low impedance path to the first voltage reference $V_1$ for RF signals reaching the star node 158. Although the capacitor 151 can also load the envelope tracker 30, the capacitor 151 can be included in configurations in which additional capacitance is needed for the power amplifier system 150 to adequately function over varying VSWR or other system parameters. In some implementations, the capacitor 151 has a capacitance in the range of about 30 pF to about 200 pF.

In one embodiment, the capacitor 151 is formed on an MCM. For example, in one implementation, the capacitor 151 is a surface mount component disposed on a laminate of an MCM. However, other implementations are possible, including, for example, configurations in which the capacitor 151 is disposed on a phone board.

Figure 12A:
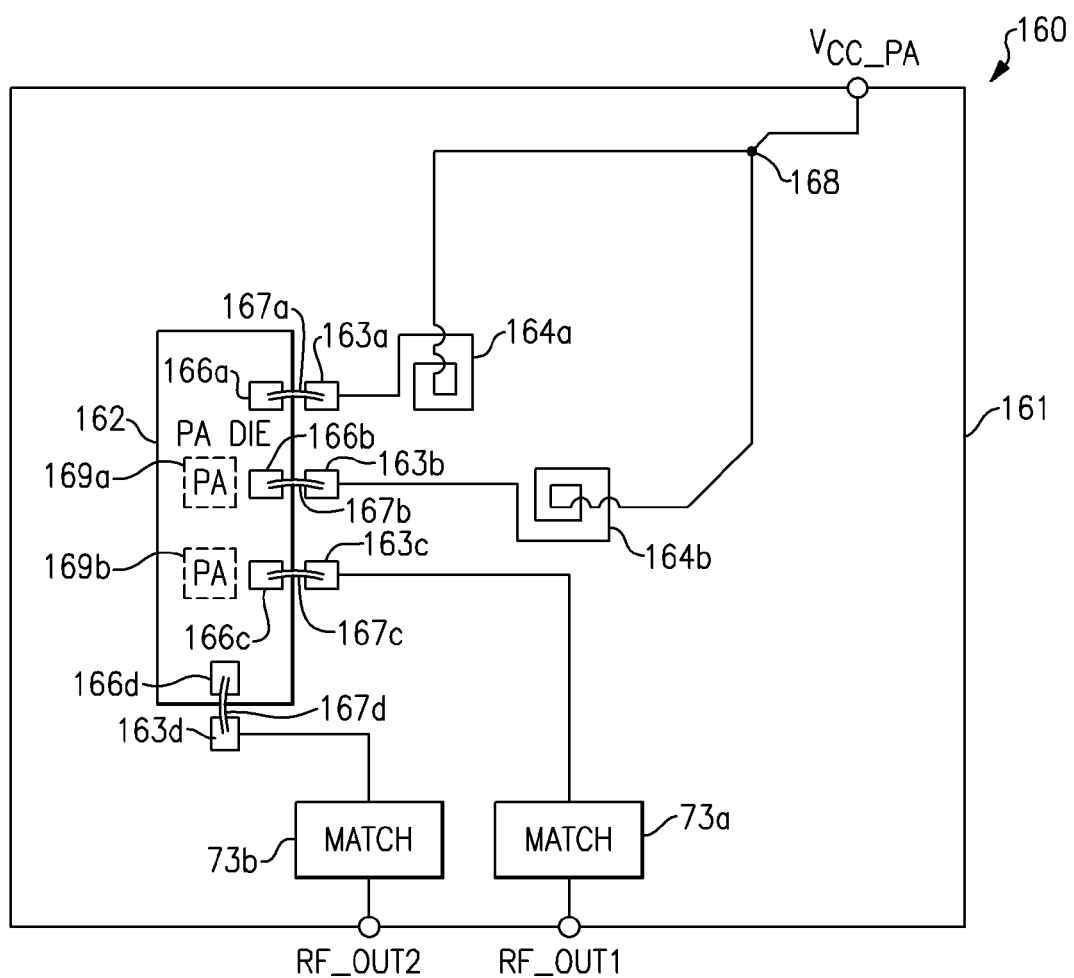
FIGS. 12A-12C are schematic diagrams of various embodiments of MCMs.
Figure 12B:
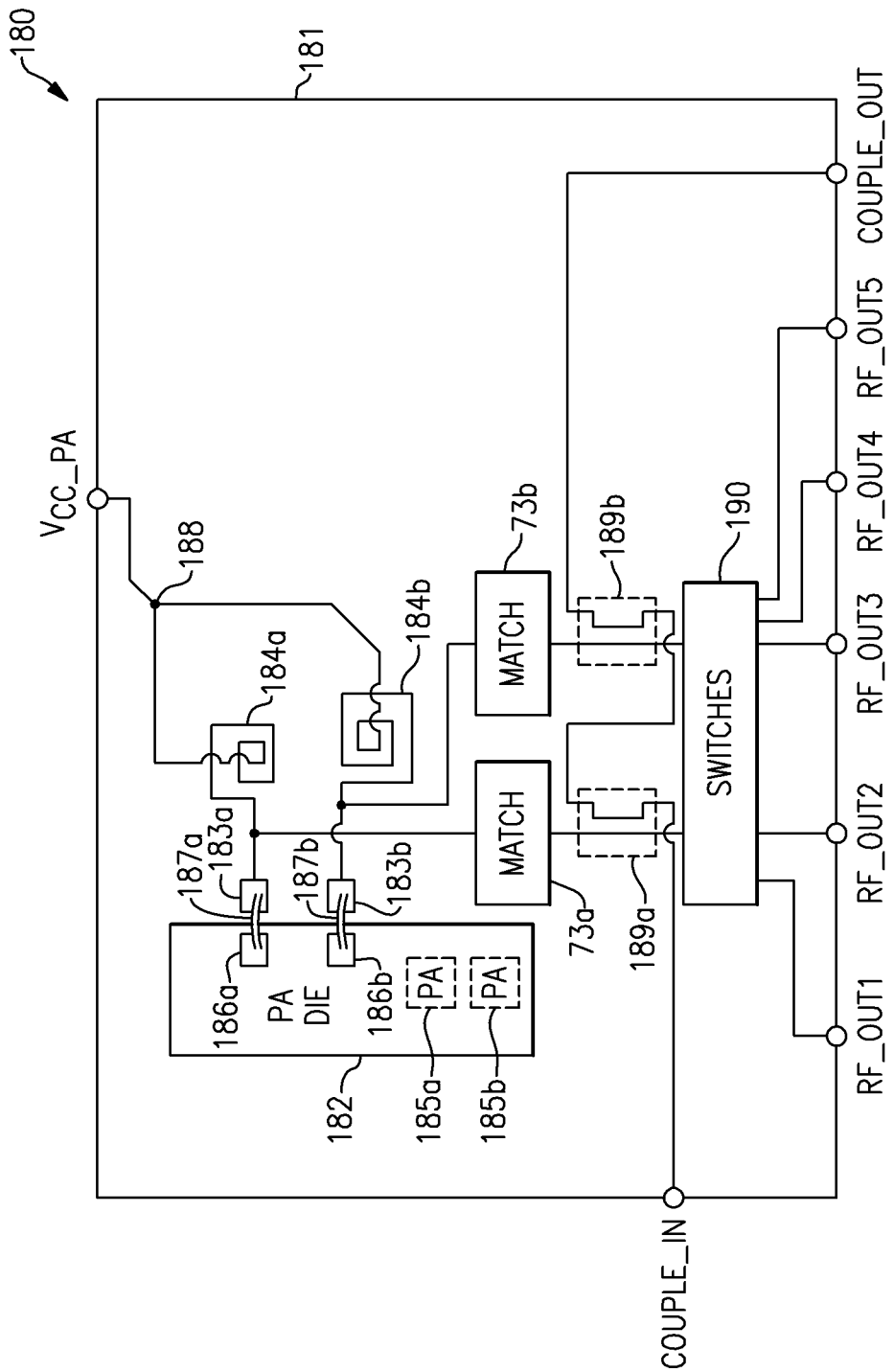
Figure 12C:
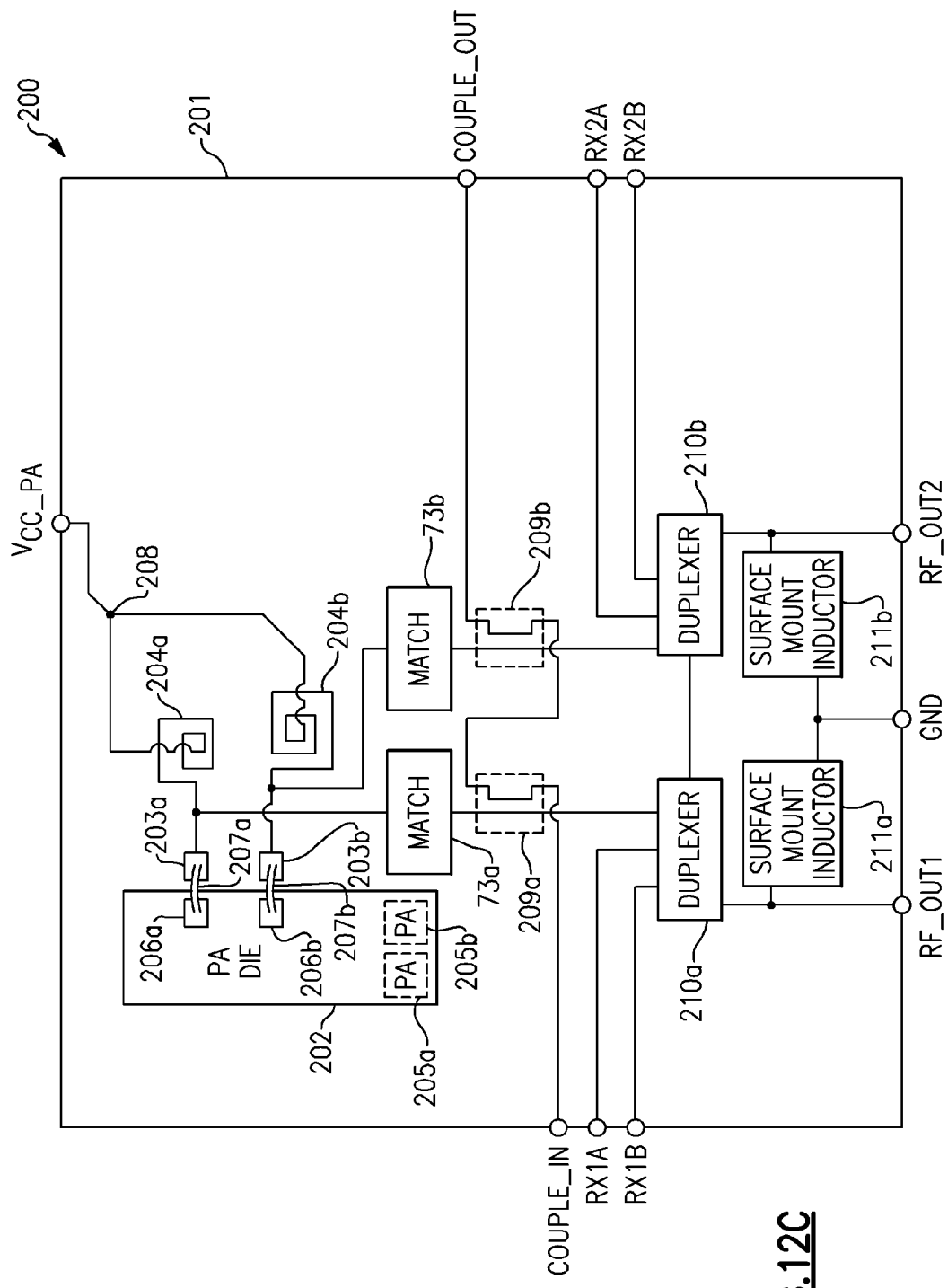

FIGS. 12A-12C are schematic diagrams of various embodiments of MCMs.

FIG. 12A is a schematic diagram of an MCM 160 including a substrate 161, a power amplifier die 162, the first impedance matching network 73a, and the second impedance matching network 73b. The MCM 160 further includes a power supply pin $V_{CC\_PA}$, a first output pin RF_OUT1, and a second output pin RF_OUT2. Although FIG. 12A illustrates a configuration having two output pins, the MCM 160 can be adapted to include additional output pins. Additionally, the MCM 160 typically includes additional pins, such as one or more input pins, control pins, harmonic termination pins, ground pins and/or other supply pins.

The power amplifier die 162 includes a first power amplifier 169a and a second power amplifier 169b. Additionally, the power amplifier die 162 includes a first pad 166a, a second pad 166b, a third pad 166c, and a fourth pad 166d. Although not illustrated for clarity, the power amplifier die 162 can include additional pads for providing other signal, ground, and power connections.

In the illustrated configuration, the first and third pads 166a, 166c are electrically connected to one another within the power amplifier die 162 and to the output of the first power amplifier 169a. Likewise, the second and fourth pads 166b, 166d are electrically connected to one another within the power amplifier die 162 and to the output of the second power amplifier 169b. Thus, in contrast to the configuration of FIG. 7 in which the output of each power amplifier is split between a choke inductor and a matching network using trace on the MCM substrate, FIG. 12A illustrates a configuration in which the outputs of the first and second power amplifiers 169a, 169b are each split within the power amplifier die 162 and brought to separate pads. Accordingly, the power amplifier die 162 includes separate pads for signal and power connections for each of the first and second power amplifiers 169a, 169b.

The first and second pads 166a, 166b can thus operate as supply inputs for providing a supply voltage received on the power supply pin $V_{CC\_PA}$ to the first and second power amplifiers 169a, 169b, respectively. Additionally, the third and fourth pads 166c, 166d can operate as amplified RF signal outputs for providing amplified RF signals to the first and second output pins RF_OUT1, RF_OUT2, respectively.

The substrate 161 includes first and second inductors 164a, 164b, first to fourth pads 163a-163d, and various traces for providing interconnections between pins, pads and other components of the MCM 160. In certain implementations, the substrate 161 is a multi-layer laminate including a plurality of alternating conductive layers and non-conductive layers. Although not illustrated in FIG. 12A, the substrate 161 can include structures in addition to those shown.

The power amplifier die 162 has been attached to the substrate 161, and bond wires have been used to provide interconnection between the pads 166a-166d of the power amplifier die 162 and the pads 163a-163d of the package substrate 161. For example, a first bond wire 167a is electrically connected between the first pad 163a of the substrate 161 and the first pad 166a of the power amplifier die 162, a second bond wire 167b is electrically connected between the second pad 163b of the substrate 161 and the second pad 166b of the power amplifier die 162, a third bond wire 167c is electrically connected between the third pad 163c of the substrate 161 and the third pad 166c of the power amplifier die 162, and a fourth bond wire 167d is electrically connected between the fourth pad 163d of the substrate 161 and the fourth pad 166d of the power amplifier die 162.

The first inductor 164a includes a first end electrically connected to the first pad 163a and a second end electrically connected to a star node 168 using a first portion of trace. The second inductor 164b includes a first end electrically connected to the second pad 163b and a second end electrically connected to the star node 168 using a second portion of trace. The star node 168 is further connected to the power supply pin $V_{CC\_PA}$ using a third portion of trace. The power supply associated with the power supply pin $V_{CC\_PA}$ and the first and second power amplifiers 169a, 169b has been configured as a star network. Additional details of the star network can be as described earlier.

The first impedance matching network 73a has been electrically connected between the first output pin RF_OUT1 and the third pad 163c of the substrate 161. Additionally, the second impedance matching network 73b has been electrically connected between the second output pin RF_OUT2 and the fourth pad 163d of the substrate 161. Additional details of the first and second impedance matching networks 73a, 73b can be similar to those described earlier.

FIG. 12B is a schematic diagram of an MCM 180 including a substrate 181, a power amplifier die 182, the first impedance matching network 73a, the second impedance matching network 73b, a first directional coupler 189a, a second directional coupler 189b, and switches 190. The MCM 180 further includes a power supply pin $V_{CC\_PA}$, a first output pin RF_OUT1, a second output pin RF_OUT2, a third output pin RF_OUT3, a fourth output pin RF_OUT4, a fifth output pin RF_OUT5, a direction coupler input pin COUPLE_IN, and a directional coupler output pin COUPLE_OUT. Although FIG. 12B illustrates a configuration having five output pins, the MCM 180 can be adapted to include additional output pins. Additionally, the MCM 180 typically includes additional pins, such as one or more input pins, control pins, harmonic termination pins, ground pins and/or other supply pins.

The power amplifier die 182 includes a first power amplifier 185a and a second power amplifier 185b. Additionally, the power amplifier die 182 includes a first pad 186a and a second pad 186b. Although not illustrated for clarity, the power amplifier die 182 can include additional pads for providing other signal, ground, and power connections.

The substrate 181 includes first and second inductors 184a, 184b, first and second pads 183a, 183b, and traces. Although not illustrated in FIG. 12B, the substrate 181 can include structures in addition to those shown. A first bond wire 187a has been electrically connected between the first pad 183a of the substrate 181 and the first pad 186a of the power amplifier die 182, and a second bond wire 187b has been electrically connected between the second pad 183b of the substrate 181 and the second pad 186b of the power amplifier die 182. The substrate 181 has been used to electrically power the first and second power amplifiers 185a, 185b using a star network. For example, the power supply pin $V_{CC\_PA}$ has been electrically connected to a star node 188, and the first and second inductors 184a, 184b have been electrically connected between the star node 188 and the first and second pads 183a, 183b, respectively. Additional details of the star network can be as described earlier.

The first impedance matching network 73a has been electrically connected between the first pad 183a and a first input of the switches 190, and the second impedance matching network 73b has been electrically connected between the second pad 183b and a second input of the switches 190. The switches 190 further include a plurality of outputs electrically connected to the first to fifth output pins RF_OUT1 to RF_OUT5, respectively. The switches 190 can be used to selectively connect the outputs of the first and second power amplifiers 185a, 185b to the first to fifth output pins RF_OUT1 to RF_OUT5, thereby allowing the first and second power amplifiers 185a, 185b to operate over a plurality of different frequency bands. For example, in one embodiment the first power amplifier 185a is a low band power amplifier and the second power amplifier 185b is a high band power amplifier.

The first and second directional couplers 189a, 189b have been included to measure a power level of RF signals traveling into the first and second inputs of the switches 190, respectively. In the illustrated configuration, the first and second directional couplers 189a, 189b have been connected in a daisy chain configuration to reduce a pin count of the MCM 180 relative to a configuration in which the first and second directional couplers include separate input and output pins. However, other configurations are possible.

FIG. 12C is a schematic diagram of an MCM 200 including a substrate 201, a power amplifier die 202, the first impedance matching network 73a, the second impedance matching network 73b, a first directional coupler 209a, a second directional coupler 209b, a first duplexer 210a, a second duplexer 210b, a first surface mount inductor 211a, and a second surface mount inductor 211b. The MCM 200 further includes a power supply pin $V_{CC\_PA}$, a first output pin RF_OUT1, a second output pin RF_OUT2, a direction coupler input pin COUPLE_IN, a directional coupler output pin COUPLE_OUT, a first receive pin RX1A, a second receive pin RX1B, a third receive pin RX2A, a fourth receive pin RX2B, and a ground pin GND.

The power amplifier die 202 includes a first power amplifier 205a and a second power amplifier 205b. Additionally, the power amplifier die 202 includes a first pad 206a and a second pad 206b. Although not illustrated for clarity, the power amplifier die 202 can include additional pads for providing other signal, ground, and power connections.

The substrate 201 includes first and second inductors 204a, 204b, first and second pads 203a, 203b, and trace. Although not illustrated in FIG. 12C, the substrate 201 can include structures in addition to those shown. A first bond wire 207a has been electrically connected between the first pad 203a of the substrate 201 and the first pad 206a of the power amplifier die 202, and a second bond wire 207b has been electrically connected between the second pad 203b of the substrate 201 and the second pad 206b of the power amplifier die 202. The substrate 201 has been used to electrically power the first and second power amplifiers 205a, 205b in a star configuration. For example, the power supply pin $V_{CC\_PA}$ has been electrically connected to a star node 208, and the first and second inductors 204a, 204b have been electrically connected between the star node 208 and the first and second pads 203a, 203b, respectively. Additional details of the star network can be similar to those described earlier.

The first impedance matching network 73a has been electrically connected between the first pad 203a and a first input of the first duplexer 210a. Likewise, the second impedance matching network 73b has been electrically connected between the second pad 203b and a first input of the second duplexer 210b. Additional details of the first and second impedance matching networks 73a, 73b can be as described earlier.

The first duplexer 210a further includes a second input and a third input electrically connected to the first receive pin RX1A and to the second receive pin RX1B, respectively, which can collectively operate as a first differential receive voltage. Likewise, the second duplexer 210b further includes a second input and a third input electrically connected to the third receive pin RX2A and to the fourth receive pin RX2B, respectively, which can collectively operate as a second differential receive voltage. The first and second duplexers 210a, 210b include outputs electrically connected to the first and second output pins RF_OUT1, RF_OUT2, respectively, and can be used to duplex between transmit and receive paths. To help provide impedance matching between the first and second output pins RF_OUT1, RF_OUT2 when the output pins are connected to antennas, first and second surface mount inductors 211a, 211b have been electrically connected between the ground pin GND and the first and second output pins RF_OUT1, RF_OUT2, respectively.

The first and second directional couplers 209a, 209b have been included to measure a power level of RF signals traveling from the first and second power amplifiers 205a, 205b into the first and second duplexers 210a, 210b, respectively. In the illustrated configuration, the first and second directional couplers 209a, 209b have been connected in a daisy chain configuration. However, other configurations are possible.

Figure 13A:
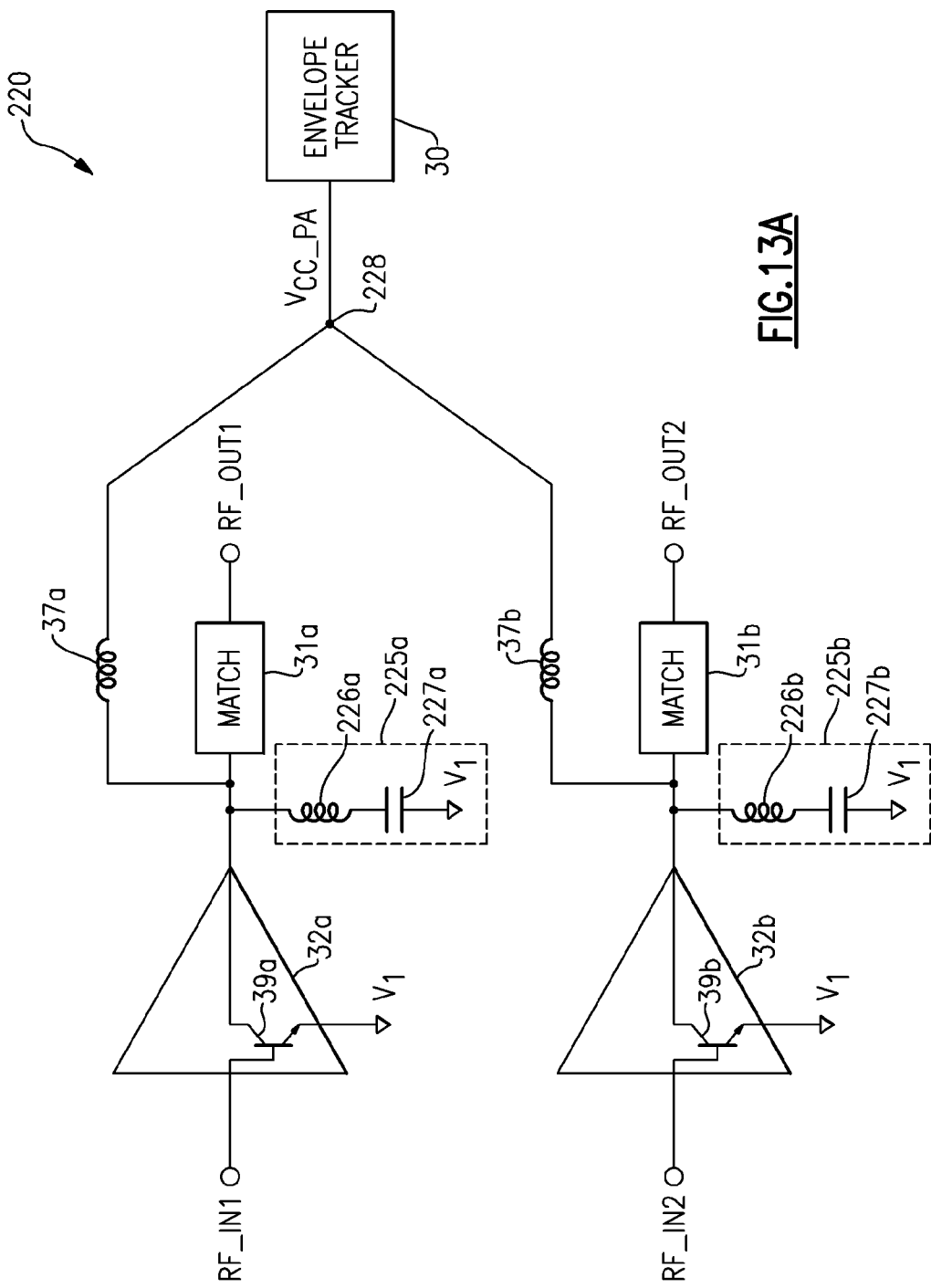
FIGS. 13A-13B are schematic diagrams of various embodiments of power amplifier systems.
Figure 13B:
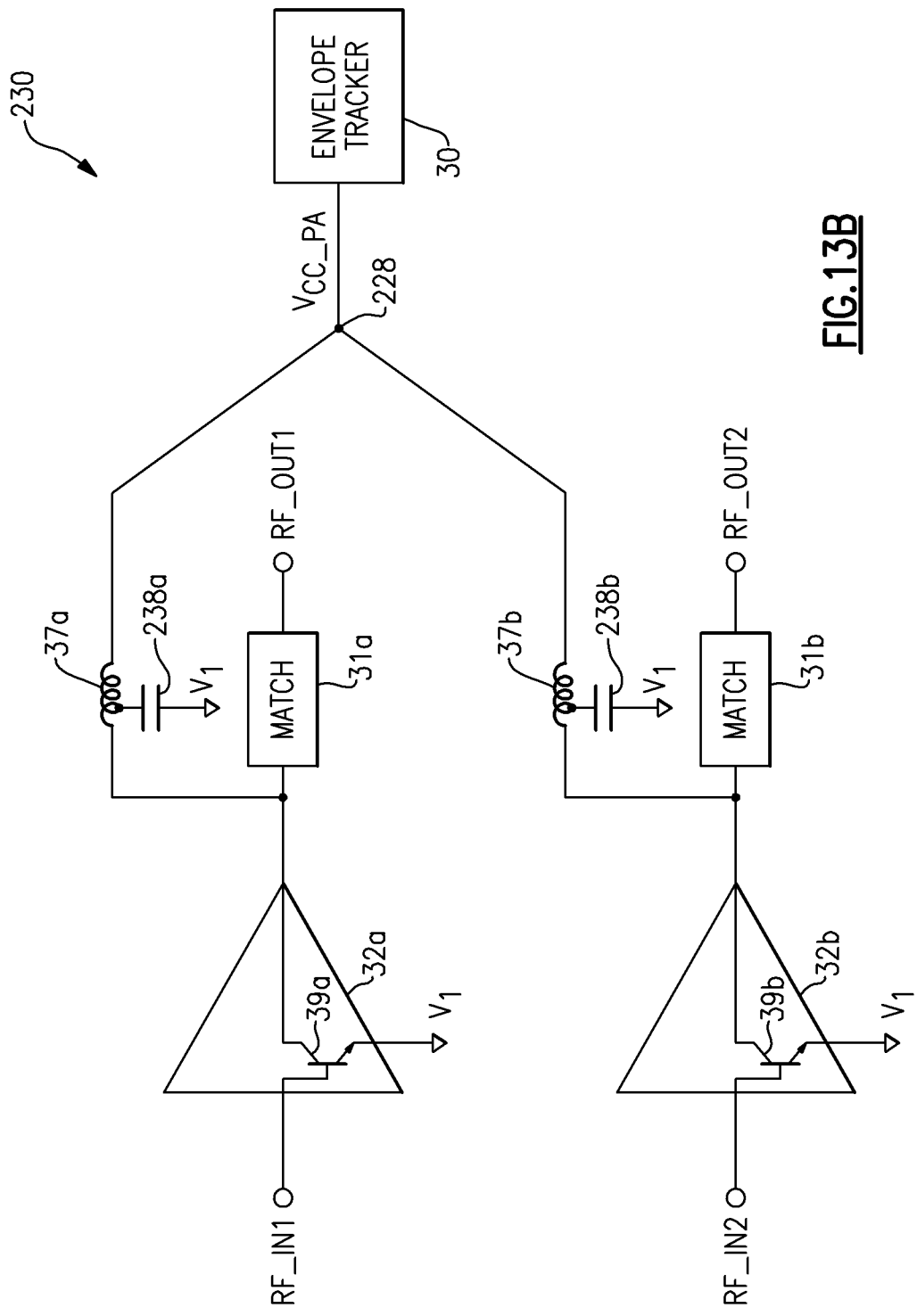

FIGS. 13A-13B are schematic diagrams of various embodiments of power amplifier systems.

FIG. 13A is a schematic diagram of another embodiment of a power amplifier system 220. The power amplifier system 220 includes the envelope tracker 30, first and second impedance matching blocks 31a, 31b, first and second power amplifiers 32a, 32b, first and second inductors 37a, 37b, and first and second harmonic termination blocks 225a, 225b.

The first power amplifier 32a is configured to amplify a first RF signal RF_IN1 to generate a first amplified RF signal RF_OUT1. Additionally, the second power amplifier 32b is configured to amplify a second RF signal RF_IN2 to generate a second amplified RF signal RF_OUT2. Although FIG. 13A illustrates a configuration using two power amplifiers 32a, 32b, the power amplifier system 220 can be adapted to include more or fewer power amplifiers. Each of the first and second power amplifiers 32a, 32b includes a bipolar transistor for providing amplification in a manner similar to that described earlier with respective to FIGS. 3 and 7. For example, the first power amplifier 32a includes a first bipolar transistor 39a and the second power amplifier 32b includes a second bipolar transistor 39b. The emitters of the first and second bipolar transistors 39a, 39b can each be electrically connected to the first voltage reference $V_1$, and the bases of the first and second bipolar transistors 39a, 39b can be configured to receive the first and second RF signals RF_IN1, RF_IN2, respectively. Additionally, the collectors of the first and second bipolar transistors 39a, 39b can be electrically connected to first and second impedance matching blocks 31a, 31b, to the first and second harmonic termination blocks 225a, 225b, and to the first and second inductors 37a, 37b, respectively.

The first and second inductors 37a, 37b can also be electrically connected to a star node 228. The star node 228 can also be electrically connected to the envelope tracker 30, which can be used to prove a power amplifier supply voltage $V_{CC\_PA}$ to the first and second power amplifiers 32a, 32b.

The first and second harmonic termination blocks 225a, 225b can be used to provide a low impedance path to RF signals having a frequency of about twice the fundamental frequency of the first and second amplified RF output signals RF_OUT1, RF_OUT2, respectively. The first harmonic termination block 225a includes a first inductor 226a and a first capacitor 227a electrically connected in series between the collector of the first bipolar transistor 39a and the first voltage reference $V_1$. Likewise, the second harmonic termination block 225b includes a second inductor 226b and a second capacitor 227b electrically connected in series between the collector of the second bipolar transistor 39b and the first voltage reference $V_1$.

FIG. 13B is a schematic diagram of yet another embodiment of a power amplifier system 230. The power amplifier system 230 includes the envelope tracker 30, first and second impedance matching blocks 31a, 31b, the first and second power amplifiers 32a, 32b, the first and second inductors 37a, 37b, and first and second harmonic termination capacitors 238a, 238b.

The power amplifier system 230 of FIG. 13B can be similar to the power amplifier system 220 of FIG. 13A, except that the power amplifier system 230 includes the first and second harmonic termination capacitors 238a, 238b. In certain implementations, the first and second harmonic termination capacitors 238a, 238b can be used for providing second harmonic termination. For example, rather than using the first and second harmonic termination blocks 225a, 225b of FIG. 13A, the first and second harmonic termination capacitors 238a, 238b can be electrically connected to a tap of the first and second inductors 37a, 37b, respectively, so as to provide harmonic termination. For instance, the first harmonic termination capacitor 238a can be electrically connected between a tap of the first inductor 37a and the first voltage reference $V_1$, and the second harmonic termination capacitor 238b can be electrically connected between a tap of the second inductor 37b and the first voltage reference $V_1$. Providing second harmonic termination in this manner can aid in providing a better distributed capacitance of the star network associated with the star node 228 relative to the scheme illustrated in FIG. 13A.

Applications

Some of the embodiments described above have provided examples in connection with mobile phones. However, the principles and advantages of the embodiments can be used for any other systems or apparatus that have needs for voltage converters.

Such voltage converters can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:
   a phone board;
   a multi-chip module disposed on the phone board, the multi-chip module including a plurality of power amplifiers formed on one or more power amplifier dies, the plurality of power amplifiers including at least three power amplifiers, each power amplifier having a supply input for receiving a power supply, the supply inputs of the plurality of power amplifiers electrically connected to one another by a first power supply network of the multi-chip module such that interconnect associated with each of the supply inputs of the power amplifiers meets at a first node, each of the plurality of power amplifiers including a first stage and a second stage, the first stage configured to drive the second stage, each of the plurality of power amplifiers including a first stage supply input, the first stage supply inputs electrically connected to a second power supply network such that interconnect associated with each of the first stage supply inputs of the power amplifiers meets at a second node; and an envelope tracking module disposed on the phone board, the envelope tracking module electrically connected to the first power supply network and configured to control a voltage level of the first power supply network, the envelope tracking module configured to electrically power the second stage of each of the plurality of power amplifiers.

2. The mobile device of claim 1 wherein a distributed capacitance of the first power supply network is configured to operate as a low impedance path to radio frequency signals so as to avoid a need for bypass capacitors local to each of the plurality of power amplifiers.

3. The mobile device of claim 1 further comprising a DC-to-DC converter disposed on the phone board, the DC-to-DC converter configured to control a voltage level of the second power supply network.

4. The mobile device of claim 1 wherein the first power supply network is electrically connected to the second power supply network on the phone board so as to reduce injection of signals from the second stages into the first stages.

5. The mobile device of claim 1 further comprising a battery electrically connected to the second power supply network.

6. The mobile device of claim 1 wherein the first node is contained within an area of a substrate of the multi-chip module that is less than about 0.16 mm$^2$.

7. The mobile device of claim 1 wherein the interconnect associated with each of the supply inputs of the power amplifiers includes a portion of trace associated with each of the supply inputs, each portion of trace having a length in the range of about 500 μm to about 5,000 μm.

8. The mobile device of claim 1 wherein the first power supply network includes a plurality of spiral inductors and has a distributed capacitance.

9. The mobile device of claim 8 wherein the envelope tracking module has a modulation bandwidth, each spiral inductor of the plurality of spiral inductors sized such that a frequency associated with a resonance of the spiral inductor and the distributed capacitance is greater than the modulation bandwidth.

10. A power amplifier module comprising:
a plurality of power amplifiers configured to amplify one or more radio frequency signals, the plurality of power amplifiers including at least three power amplifiers, each power amplifier having a supply input for receiving a power supply;
a first power supply network electrically connected to the supply inputs of each of the plurality of power amplifiers such that a portion of trace associated with each of the supply inputs of the power amplifiers meets at a first node, each portion of trace including a spiral inductor configured to operate as a radio frequency choke;
a first power supply pin electrically connected to the first node; and
a second power supply network electrically connected to a first stage supply input of each of the plurality of power amplifiers such that a portion of trace associated with each of the first stage supply inputs of the power amplifiers meets at a second node.

11. The power amplifier module of claim 10 wherein a distributed capacitance of the first power supply network is configured to operate as a low impedance path to radio frequency signals.

12. The power amplifier module of claim 10 further comprising a capacitor including a first end electrically connected to the first node and a second end electrically connected to a first voltage supply.

13. The power amplifier module of claim 11 wherein the capacitor is formed on a laminate of the power amplifier module.

14. The power amplifier module of claim 10 wherein each spiral inductor includes a capacitor electrically connected between a tap of the spiral inductor and a first voltage supply, each spiral inductor and capacitor configured to provide second harmonic termination to an associated power amplifier.

15. The power amplifier module of claim 10 further comprising a duplexer configured to duplex between a differential receive voltage and at least one output of the plurality of power amplifiers.

16. The power amplifier module of claim 10 further comprising a plurality of output pins and a plurality of switches electrically connected to a plurality of outputs of the power amplifiers, the plurality of output pins greater in number than the plurality of outputs of the power amplifiers.

17. The power amplifier module of claim 10 wherein the first node is contained within an area of a substrate of the power amplifier module that is less than about 0.16 mm$^2$.

18. A power amplifier module comprising:
a plurality of power amplifiers configured to amplify one or more radio frequency signals, the plurality of power amplifiers including at least three power amplifiers, each power amplifier having a supply input for receiving a power supply;
a first power supply network electrically connected to the supply inputs of each of the plurality of power amplifiers such that a portion of trace associated with each of the supply inputs of the power amplifiers meets at a first node, each portion of trace including a spiral inductor configured to operate as a radio frequency choke; and
a first power supply pin electrically connected to the first node and having a distributed capacitance configured to operate as a low impedance path to radio frequency signals, the first power supply pin configured to receive a supply voltage from an envelope tracker having a modulation bandwidth, each spiral inductor sized such that a frequency associated with a resonance of the spiral inductor and the distributed capacitance is greater than the modulation bandwidth.

19. The power amplifier module of claim 18 wherein the first node is contained within an area of a substrate of the power amplifier module that is less than about 0.16 mm$^2$.

20. A power amplifier module comprising:
a plurality of power amplifiers configured to amplify one or more radio frequency signals, the plurality of power amplifiers including at least three power amplifiers, each power amplifier having a supply input for receiving a power supply;

a first power supply network electrically connected to the supply inputs of each of the plurality of power amplifiers such that a portion of trace associated with each of the supply inputs of the power amplifiers meets at a first node, each portion of trace including a spiral inductor configured to operate as a radio frequency choke, each portion of trace associated with the supply inputs of the power amplifiers having a length in the range of about 500 μm to about 5,000 μm; and a first power supply pin electrically connected to the first node.

21. The power amplifier module of claim 20 wherein the first node is contained within an area of a substrate of the power amplifier module that is less than about 0.16 mm$^2$.

* * * * *